US012568730B2

(12) United States Patent
    Tomekawa

(10) Patent No.: US 12,568,730 B2
(45) Date of Patent: Mar. 3, 2026

(54) IMAGING DEVICE

(71) Applicant: Panasonic Intellectual Property Management Co., Ltd., Osaka (JP)

(72) Inventor: Yuuko Tomekawa, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 382 days.

(21) Appl. No.: 18/303,603

(22) Filed: Apr. 20, 2023

(65) Prior Publication Data

US 2023/0309332 A1     Sep. 28, 2023

Related U.S. Application Data

(63) Continuation     of     application     No. PCT/JP2021/038342, filed on Oct. 18, 2021.

(30) Foreign Application Priority Data

Nov. 13, 2020    (JP) ................................. 2020-189863

(51) Int. Cl.
    *H10K 39/32*          (2023.01)
(52) U.S. Cl.
    CPC .................................... *H10K 39/32* (2023.02)
(58) Field of Classification Search
    CPC ... H10K 39/32; H10F 39/809; H01L 21/3205; H01L 21/768
    See application file for complete search history.

(56) References Cited

U.S. PATENT DOCUMENTS

| | | | | |
|---|---|---|---|---|
| 9,812,491 B2 * | 11/2017 | Tamaki | ............... | H04N 25/709 |
| 9,894,297 B2 * | 2/2018 | Kanehara | ............ | H04N 25/779 |
| 10,057,502 B2 * | 8/2018 | Tamaki | ................. | H04N 23/21 |
| 10,062,718 B2 * | 8/2018 | Shishido | ............... | H04N 25/76 |

(Continued)

FOREIGN PATENT DOCUMENTS

| | | | | |
|---|---|---|---|---|
| CN | 108738370 A | * 11/2018 | ............. | H04N 25/57 |
| CN | 113544870 A | * 10/2021 | ........... | H04N 25/134 |

(Continued)

OTHER PUBLICATIONS

International Search Report of PCT application No. PCT/JP2021/038342 dated Dec. 28, 2021.

*Primary Examiner* — Laura M Menz

(74) *Attorney, Agent, or Firm* — Rimon P.C.

(57)                    ABSTRACT

An imaging device includes a first photoelectric converter, a first capacitive element, a second photoelectric converter, and a second capacitive element. The first photoelectric converter converts light having a wavelength in a first wavelength region into first electric charge. The first capacitive element accumulates the first electric charge. The first capacitive element includes a first electrode, a second electrode, and a first dielectric. The second photoelectric converter is arranged at a different height from the first photoelectric converter in a thickness direction of the imaging device. The second photoelectric converter converts light having a wavelength in a second wavelength region into second electric charge. The second capacitive element accumulates the second electric charge. The second capacitive element includes a third electrode, a fourth electrode, and a second dielectric.

16 Claims, 19 Drawing Sheets

(56) References Cited

U.S. PATENT DOCUMENTS

| | | | | |
|---|---|---|---|---|
| 10,199,408 B2 * | 2/2019 | Miyake | H10F 39/8053 |
| 10,609,318 B2 * | 3/2020 | Sakakibara | H10F 39/18 |
| 10,615,199 B2 * | 4/2020 | Hirase | H10F 39/8037 |
| 10,707,248 B2 * | 7/2020 | Shishido | H10F 39/8037 |
| 10,861,904 B2 * | 12/2020 | Nakata | H04N 23/12 |
| 10,879,284 B2 * | 12/2020 | Nakajun | H10F 39/8037 |
| 10,892,286 B2 * | 1/2021 | Sato | H10F 39/8037 |
| 10,893,222 B2 * | 1/2021 | Murakami | H04N 25/57 |
| 10,979,658 B2 * | 4/2021 | Yamada | H04N 25/78 |
| 11,195,865 B2 * | 12/2021 | Hirase | H10K 39/32 |
| 11,496,702 B2 * | 11/2022 | Yamada | H04N 25/65 |
| 11,532,653 B2 * | 12/2022 | Hirase | H04N 25/65 |
| 11,552,115 B2 * | 1/2023 | Shishido | H04N 25/78 |
| 11,631,707 B2 * | 4/2023 | Sato | H10F 39/8033 257/292 |
| 12,021,094 B2 * | 6/2024 | Shishido | H04N 25/78 |
| 2011/0145153 A1 * | 6/2011 | Dawson | G06Q 10/10 707/610 |
| 2014/0049675 A1 | 2/2014 | Takatsuka et al. | |
| 2016/0360134 A1 * | 12/2016 | Miyake | H10F 39/802 |
| 2017/0214871 A1 * | 7/2017 | Kanehara | H04N 25/57 |
| 2017/0221947 A1 * | 8/2017 | Shishido | H04N 25/76 |
| 2017/0263669 A1 * | 9/2017 | Tamaki | H10F 39/8033 |
| 2017/0272662 A1 * | 9/2017 | Tamaki | H10F 39/18 |
| 2017/0373107 A1 * | 12/2017 | Koga | H10F 39/12 |
| 2018/0249104 A1 | 8/2018 | Sasago et al. | |
| 2018/0294316 A1 * | 10/2018 | Tokuhara | H10K 85/6574 |
| 2018/0331141 A1 * | 11/2018 | Shishido | H10F 39/8037 |
| 2018/0350862 A1 * | 12/2018 | Nakajun | H10F 39/8023 |
| 2019/0081131 A1 | 3/2019 | Tokuhara et al. | |
| 2019/0238768 A1 * | 8/2019 | Yamada | H04N 25/78 |
| 2019/0306442 A1 * | 10/2019 | Murakami | H04N 25/573 |
| 2019/0306470 A1 * | 10/2019 | Shishido | H04N 25/78 |
| 2019/0371839 A1 * | 12/2019 | Sato | H10F 39/811 |
| 2019/0371840 A1 * | 12/2019 | Hirase | H10F 39/191 |
| 2020/0194477 A1 * | 6/2020 | Hirase | H04N 25/623 |
| 2020/0295064 A1 * | 9/2020 | Shishido | H10F 39/8063 |
| 2021/0091128 A1 * | 3/2021 | Sato | H10F 39/803 |
| 2021/0092312 A1 * | 3/2021 | Murakami | H04N 25/771 |
| 2021/0203867 A1 * | 7/2021 | Yamada | H04N 25/76 |
| 2021/0408099 A1 | 12/2021 | Sato | |
| 2021/0409634 A1 * | 12/2021 | Sato | H04N 25/17 |
| 2022/0059584 A1 * | 2/2022 | Hirase | H10F 39/191 |
| 2023/0097274 A1 * | 3/2023 | Shishido | H10F 39/18 257/292 |
| 2023/0268371 A1 * | 8/2023 | Tomekawa | H04N 23/20 257/291 |
| 2023/0309332 A1 * | 9/2023 | Tomekawa | H04N 25/73 |
| 2024/0155856 A1 * | 5/2024 | Sato | H10F 39/12 |
| 2024/0313012 A1 * | 9/2024 | Shishido | H10F 39/803 |
| 2025/0056912 A1 * | 2/2025 | Sato | H10F 39/191 |

FOREIGN PATENT DOCUMENTS

| | | | | |
|---|---|---|---|---|
| CN | 114175619 A | * | 3/2022 | H04N 25/77 |
| CN | 116368606 A | * | 6/2023 | H04N 23/20 |
| JP | 2011-243704 | | 12/2011 | |
| JP | 2014-039159 | | 2/2014 | |
| JP | 2017163010 A | * | 9/2017 | H04N 25/70 |
| JP | 2018-139375 | | 9/2018 | |
| JP | 2019-054237 | | 4/2019 | |
| JP | 7658903 B2 | * | 4/2025 | H10F 39/191 |
| KR | 20220039753 A | * | 3/2022 | H04N 25/46 |
| WO | 2011/145153 | | 11/2011 | |
| WO | WO-2017154605 A1 | * | 9/2017 | H04N 25/70 |
| WO | WO-2018025545 A1 | * | 2/2018 | H04N 25/76 |
| WO | WO-2019131028 A1 | * | 7/2019 | H04N 25/616 |
| WO | 2020/218048 | | 10/2020 | |
| WO | WO-2020218047 A1 | * | 10/2020 | H04N 25/134 |
| WO | WO-2020255999 A1 | * | 12/2020 | H04N 25/79 |
| WO | WO-2020262132 A1 | * | 12/2020 | H04N 25/79 |
| WO | WO-2021019333 A1 | * | 2/2021 | H04N 25/46 |
| WO | WO-2021149413 A1 | * | 7/2021 | H10F 39/191 |
| WO | WO-2022102342 A1 | * | 5/2022 | H04N 25/73 |
| WO | WO-2022102343 A1 | * | 5/2022 | H04N 25/70 |
| WO | WO-2023100632 A1 | * | 6/2023 | H04N 23/667 |

* cited by examiner

1

IMAGING DEVICE

BACKGROUND

1. Technical Field

The present disclosure relates to an imaging device.

2. Description of the Related Art

Imaging devices are widely used in various fields of products such as video cameras, digital still cameras, surveillance cameras, and vehicle-mounted cameras. As the imaging devices, charge-coupled device (CCD) imaging devices or complementary metal-oxide semiconductor (CMOS) imaging devices are used.

An imaging device includes a photoelectric converter. An example of the photoelectric converter includes a photodiode. Another example of the photoelectric converter includes a pair of electrodes and a photoelectric conversion layer sandwiched between these electrodes.

In recent years, imaging devices have increased in pixel density, and pixels have tended to become smaller in size. In line with this, the areas of photoelectric converters have tended to be reduced.

Japanese Unexamined Patent Application Publication No. 2011-243704 discloses an imaging device that has a plurality of photoelectric converters that are stacked. This type of imaging device may be referred to as a multilayer imaging device. Multilayer imaging devices are advantageous in terms of realization of higher pixel density.

SUMMARY

In one general aspect, the techniques disclosed here feature an imaging device including a first photoelectric converter that converts light having a wavelength in a first wavelength region into first electric charge, a first capacitive element that accumulates the first electric charge and that includes a first electrode, a second electrode, and a first dielectric, the second electrode facing the first electrode, the first dielectric being arranged between the first electrode and the second electrode, a second photoelectric converter that is arranged at a different height from the first photoelectric converter in a thickness direction of the imaging device and that converts light having a wavelength in a second wavelength region into second electric charge, and a second capacitive element that accumulates the second electric charge and that includes a third electrode, a fourth electrode, and a second dielectric, the fourth electrode facing the third electrode, the second dielectric being arranged between the third electrode and the fourth electrode.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

2

Figures 4, 5:
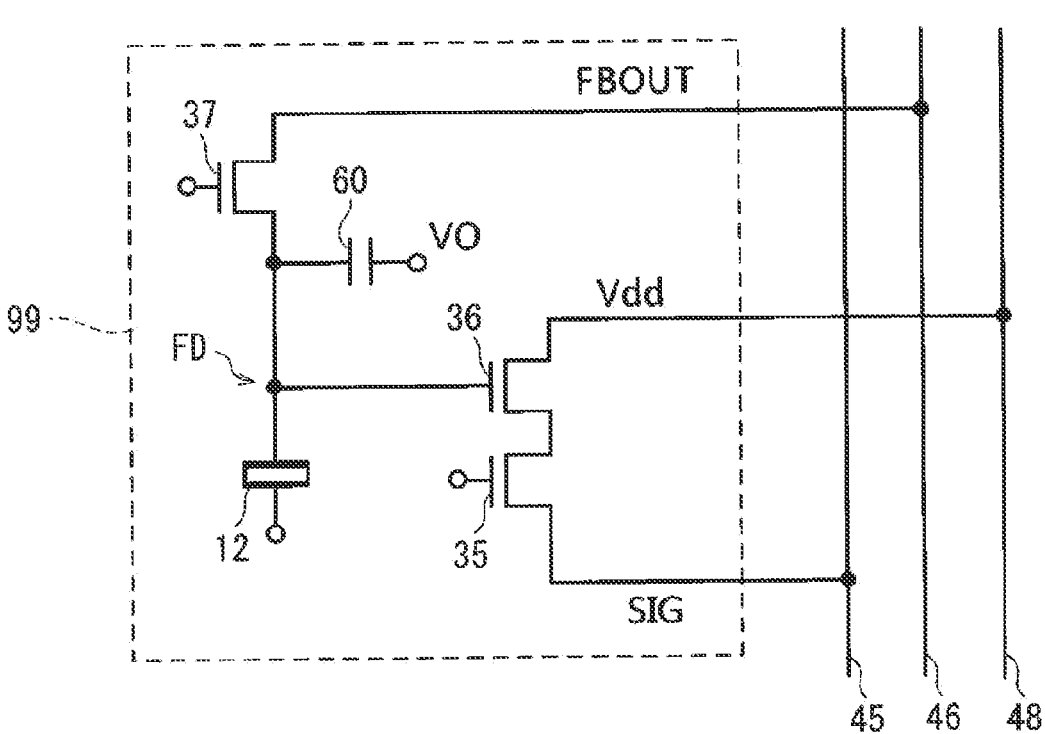
Figures 6, 7:
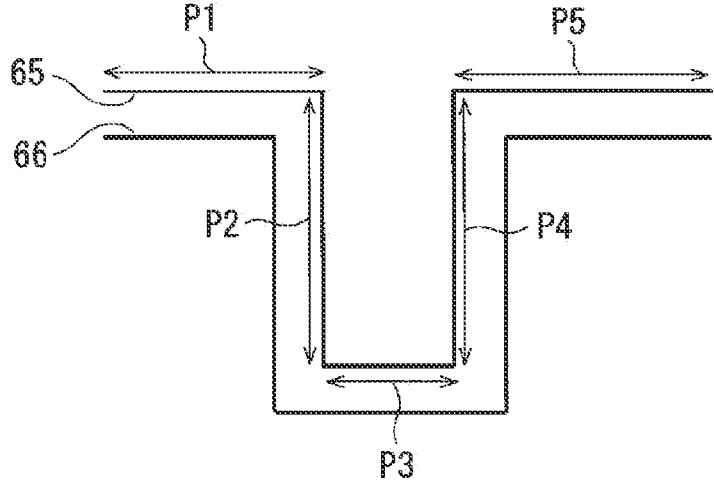
Figure 8:
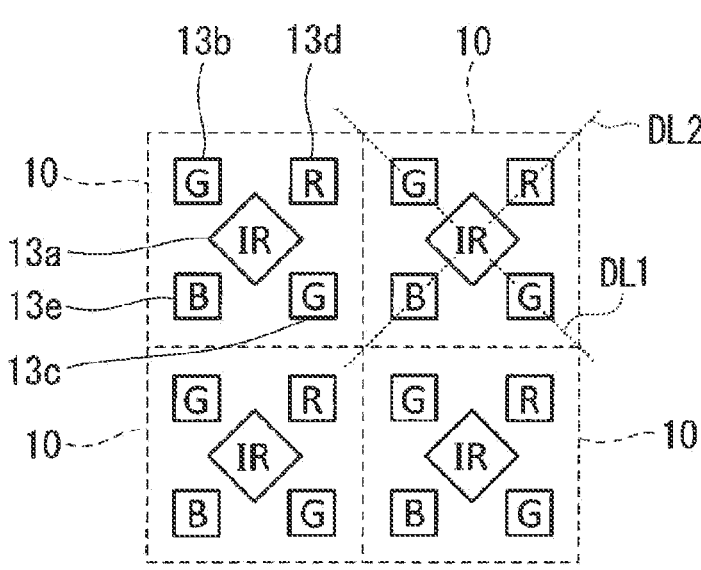
Figure 9:
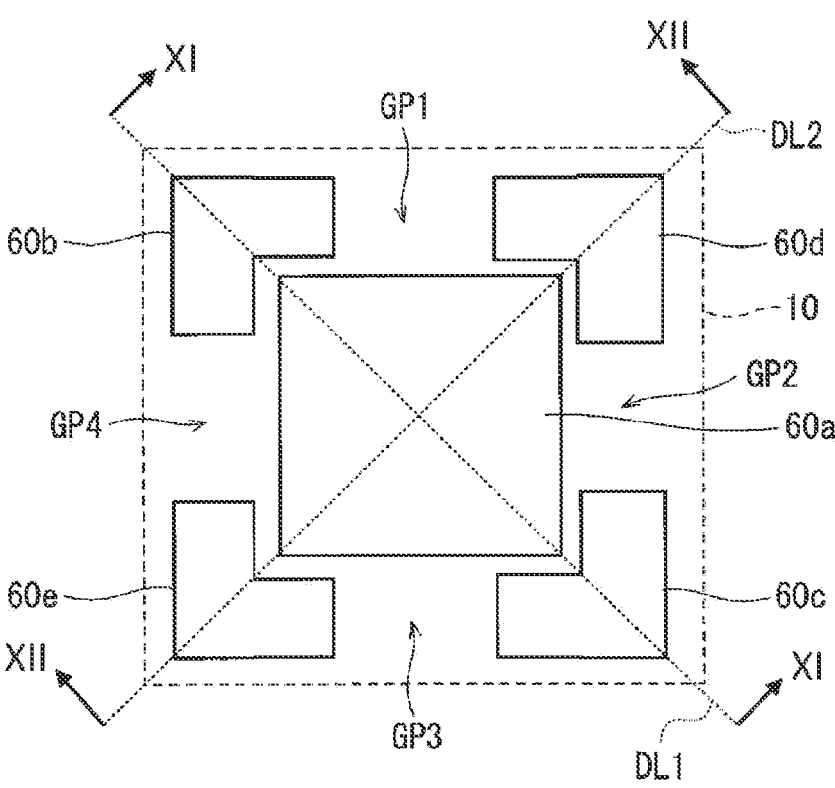
Figure 10:
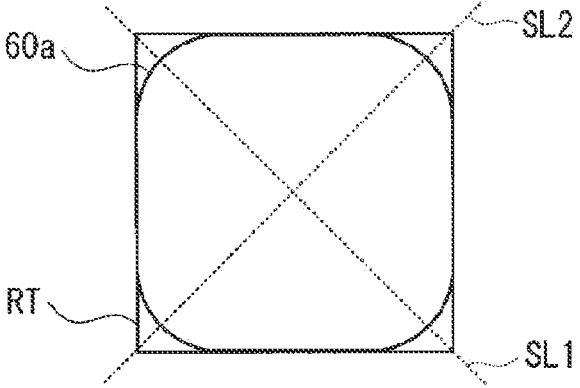
Figure 11:
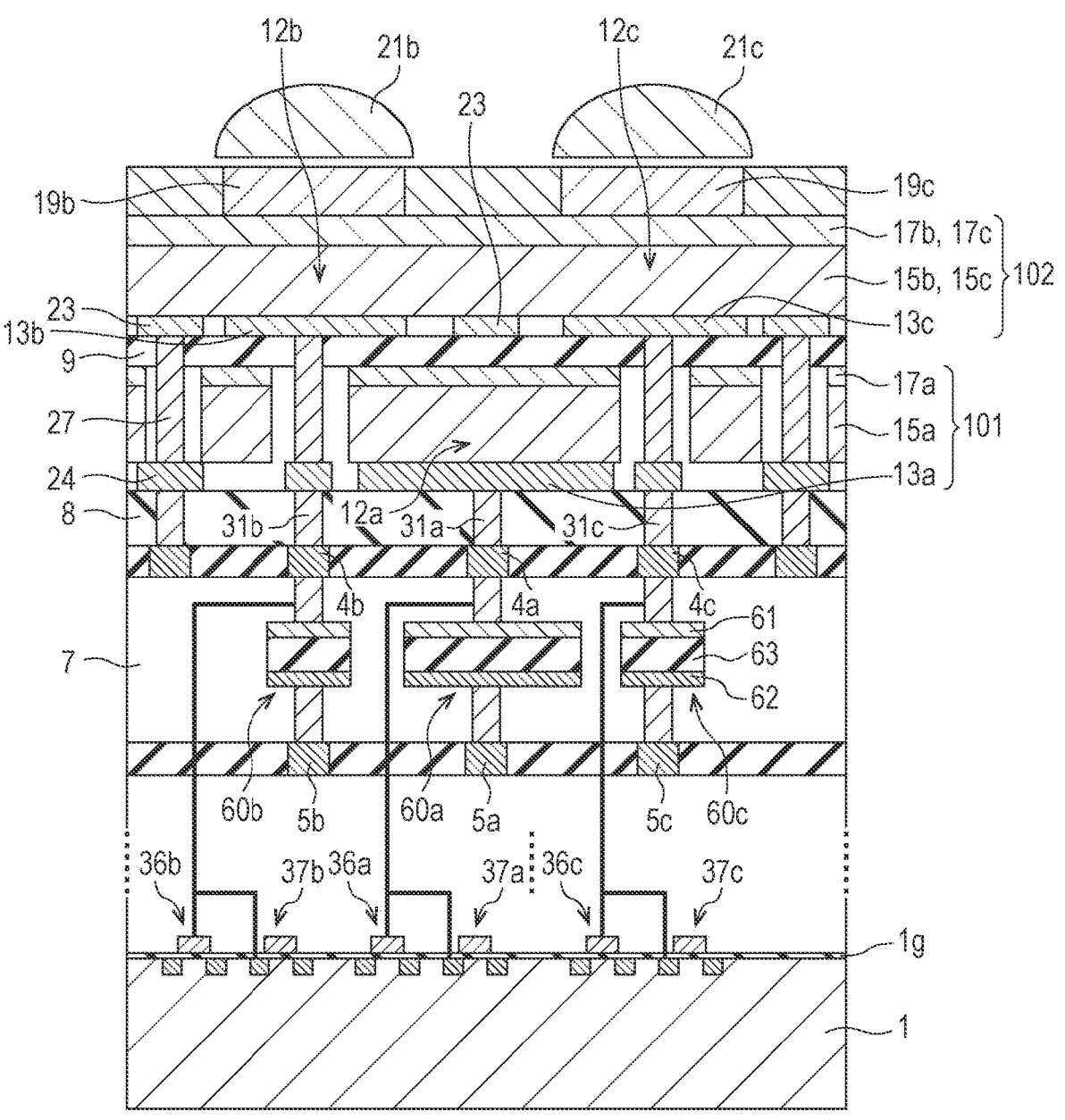
Figure 12:
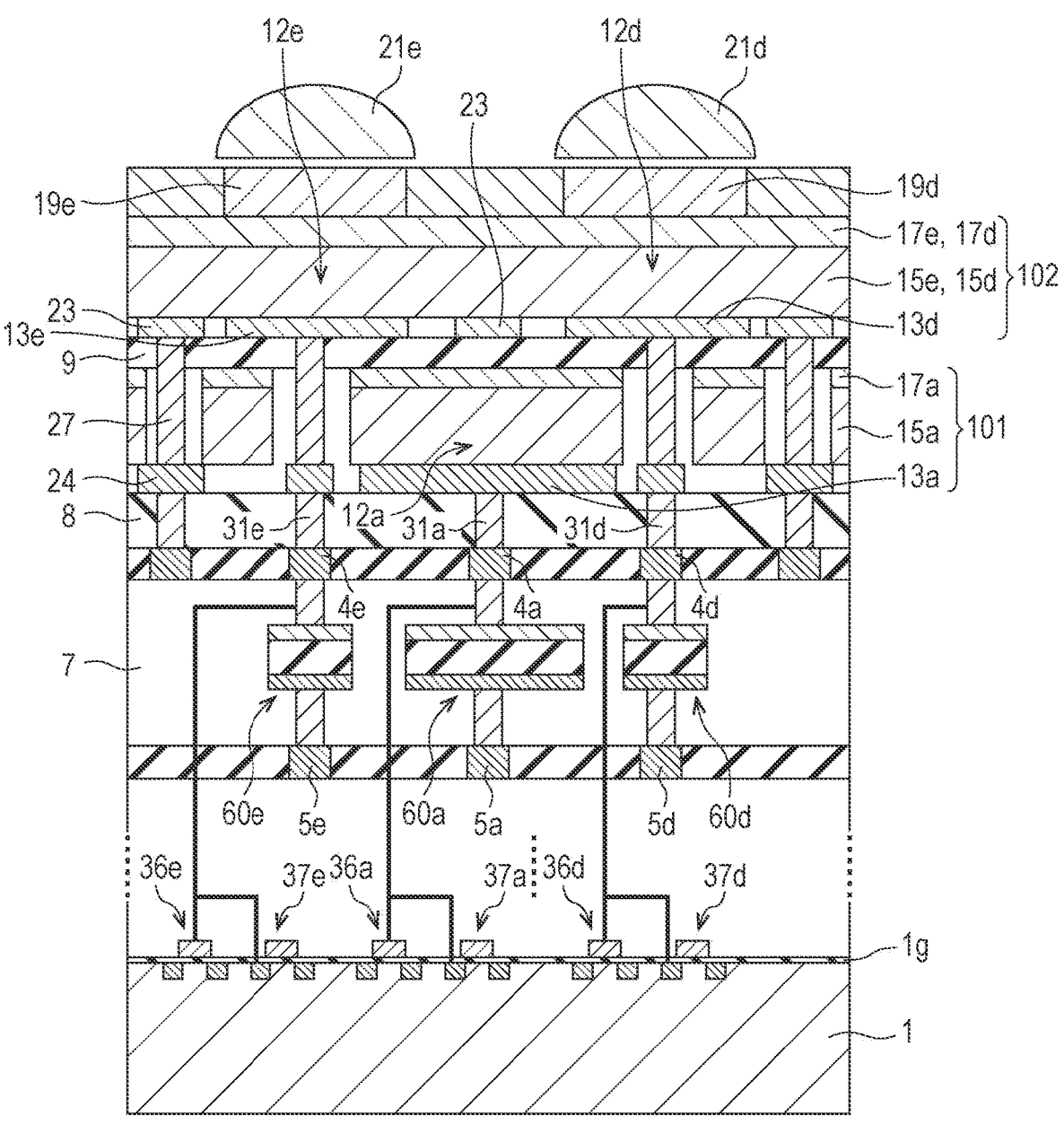
Figure 13:
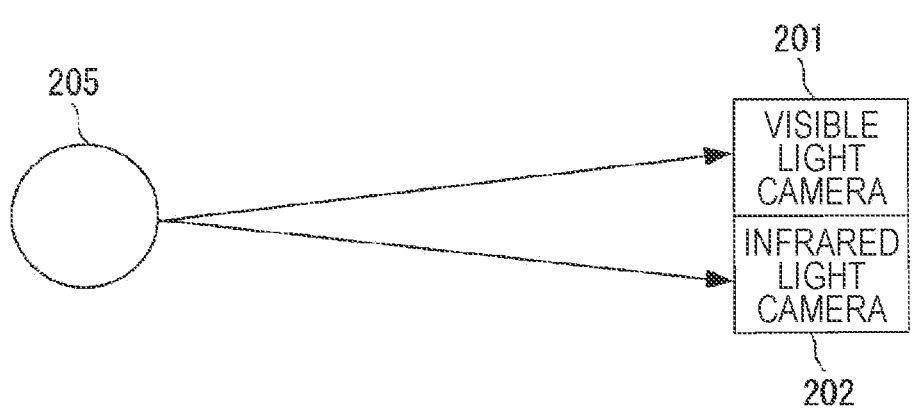
Figure 14:
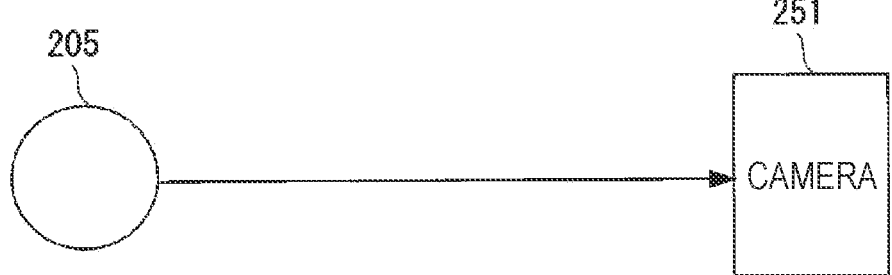
Figure 15:
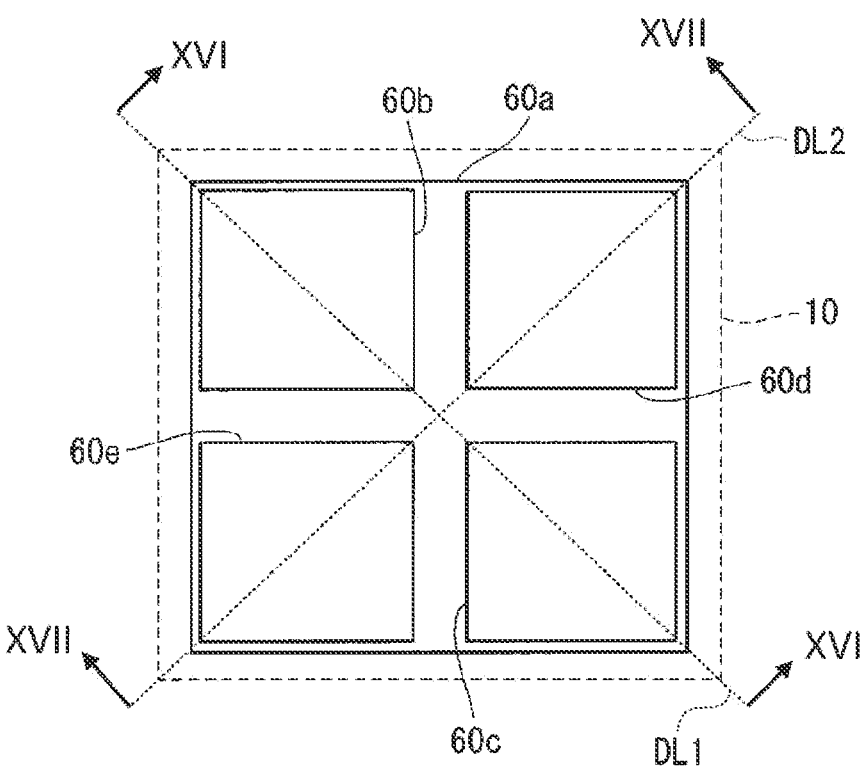
Figure 16:
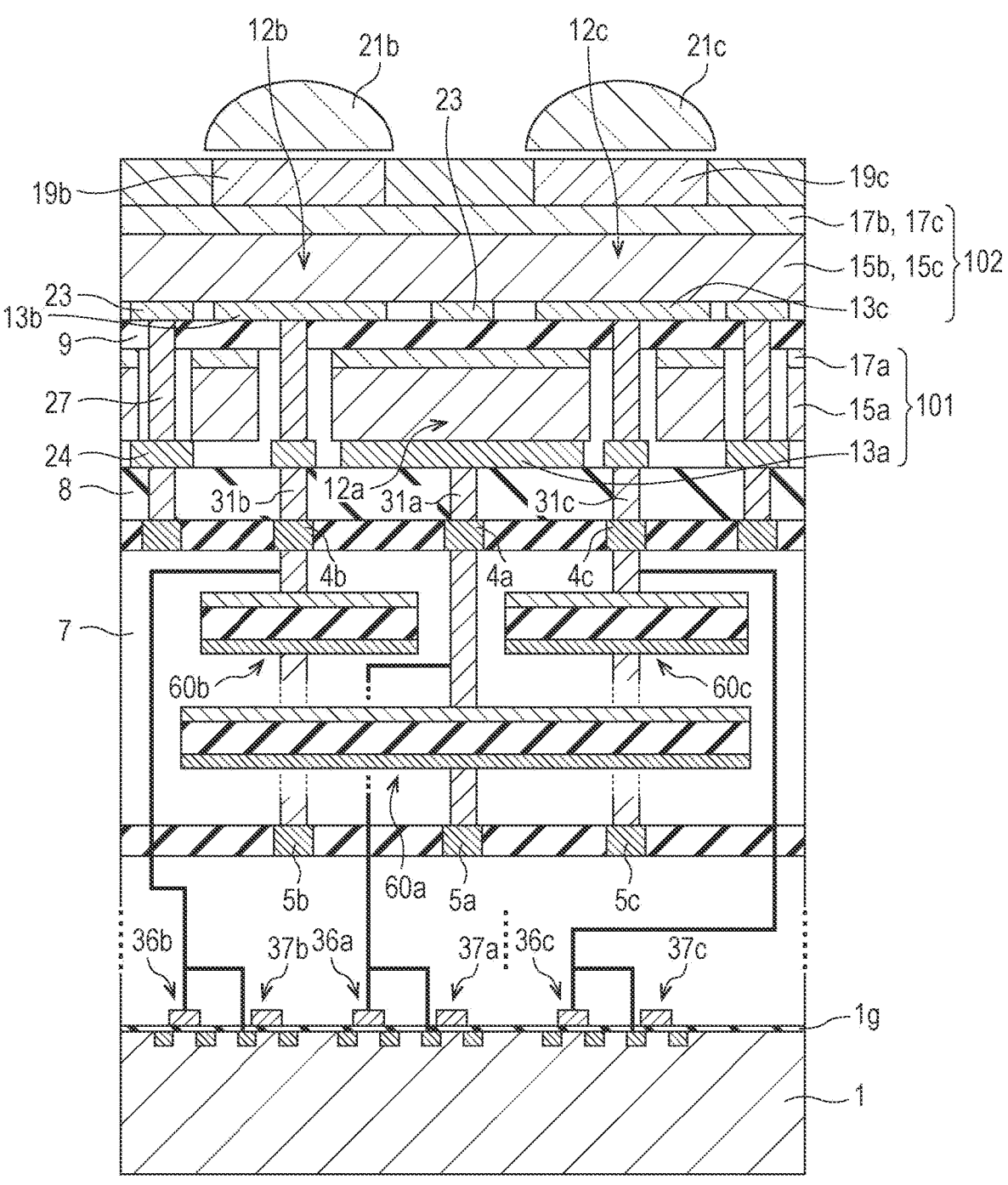
Figure 17:
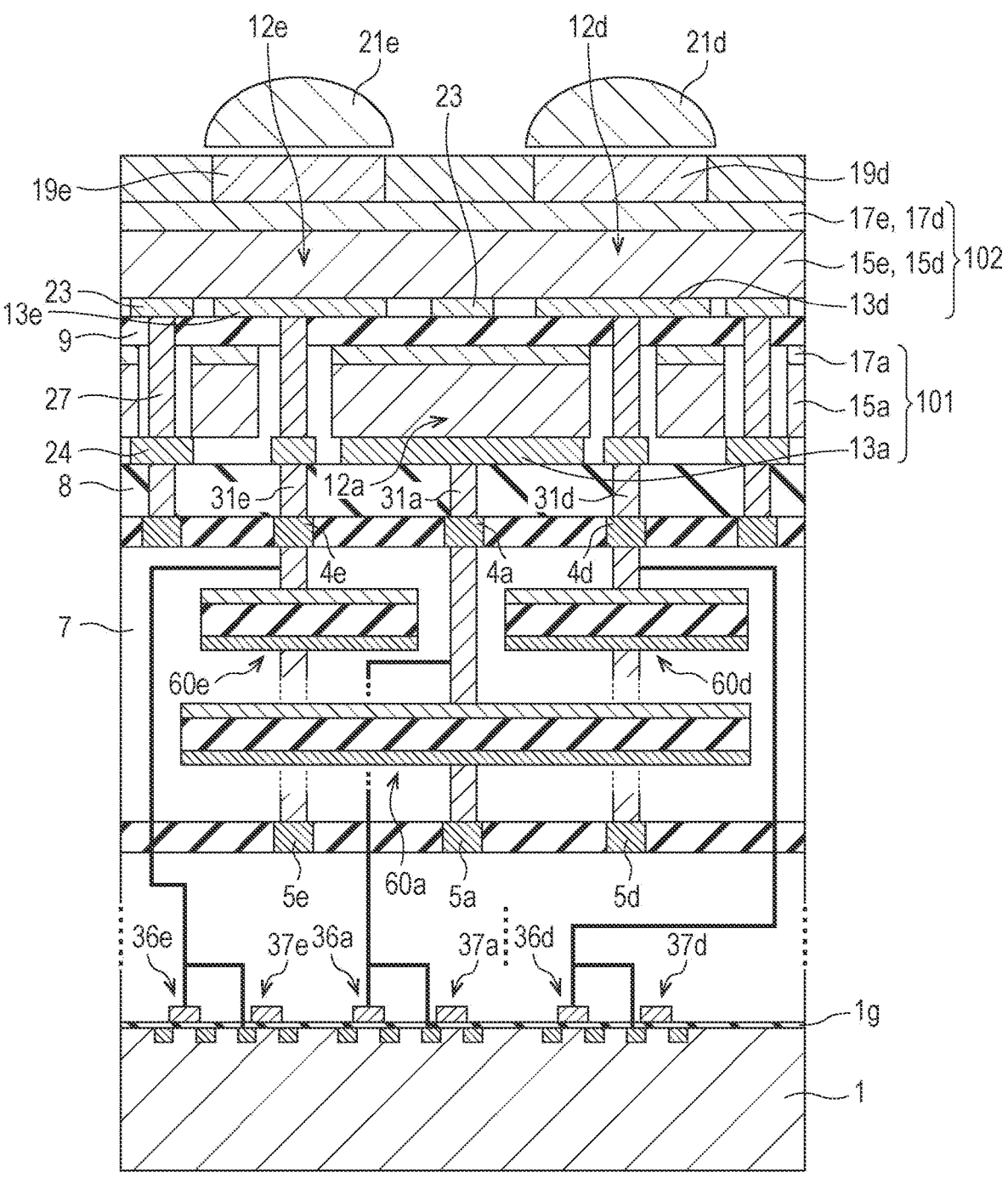
Figure 18:
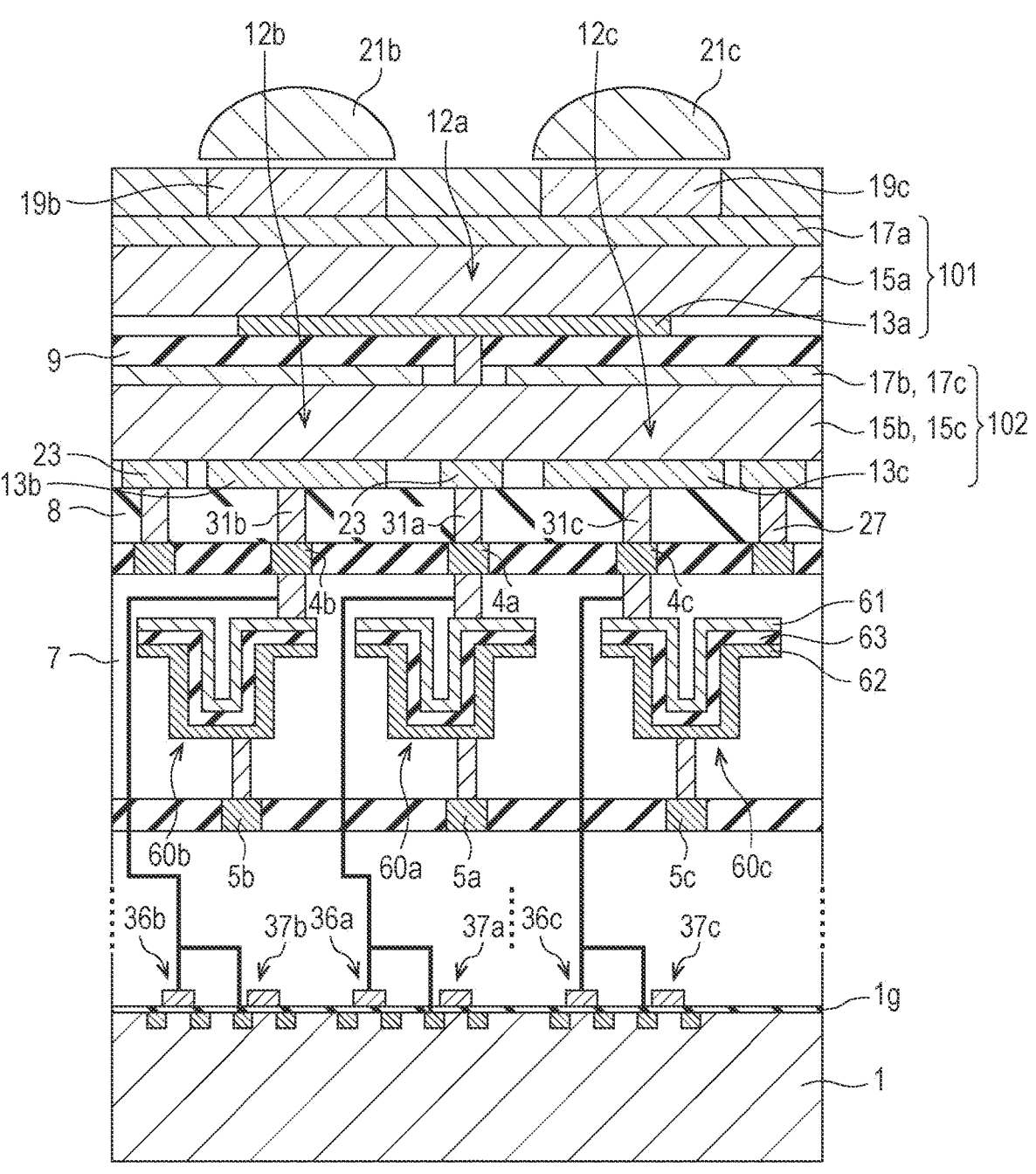
Figure 19:
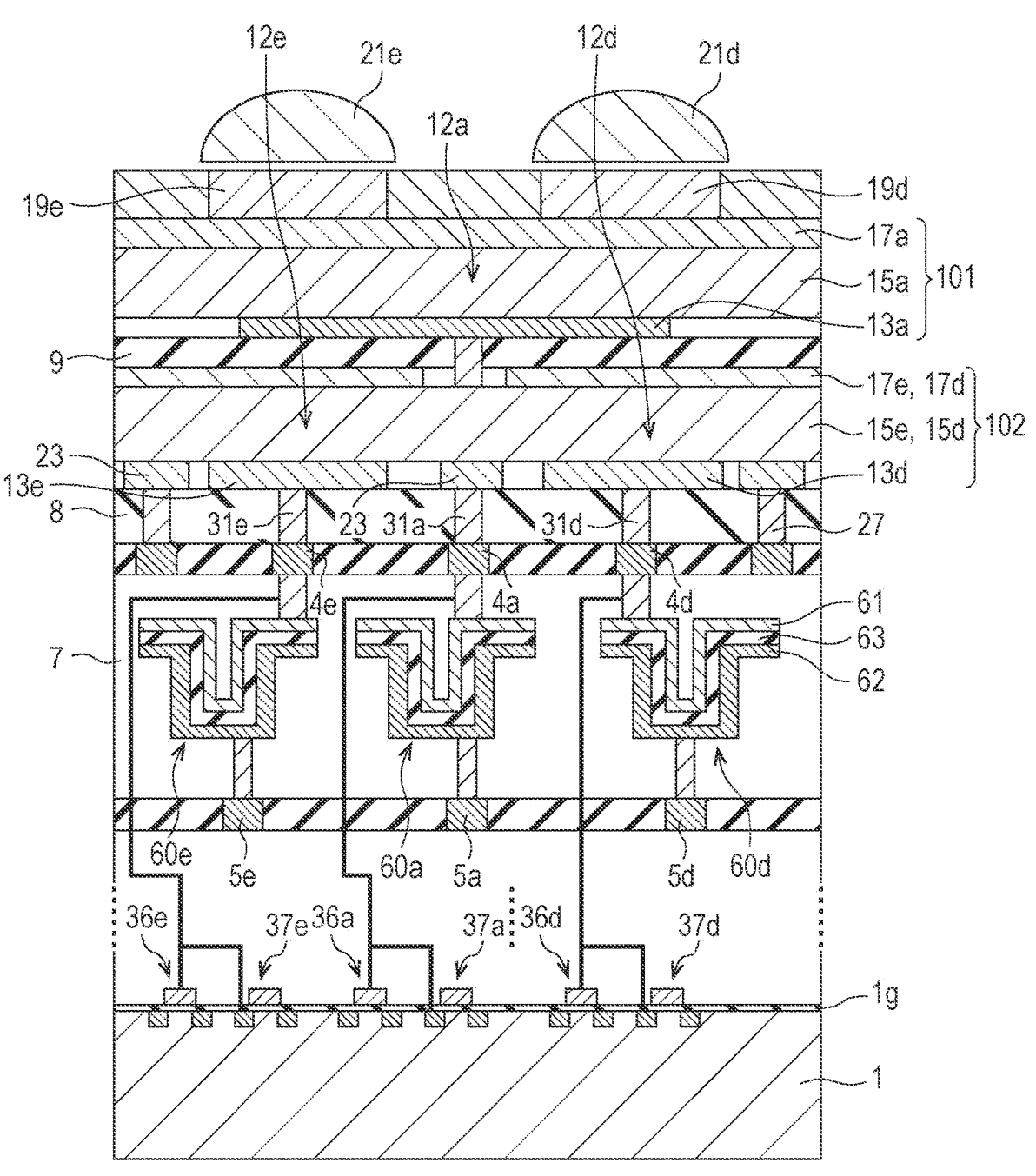
Figure 20:
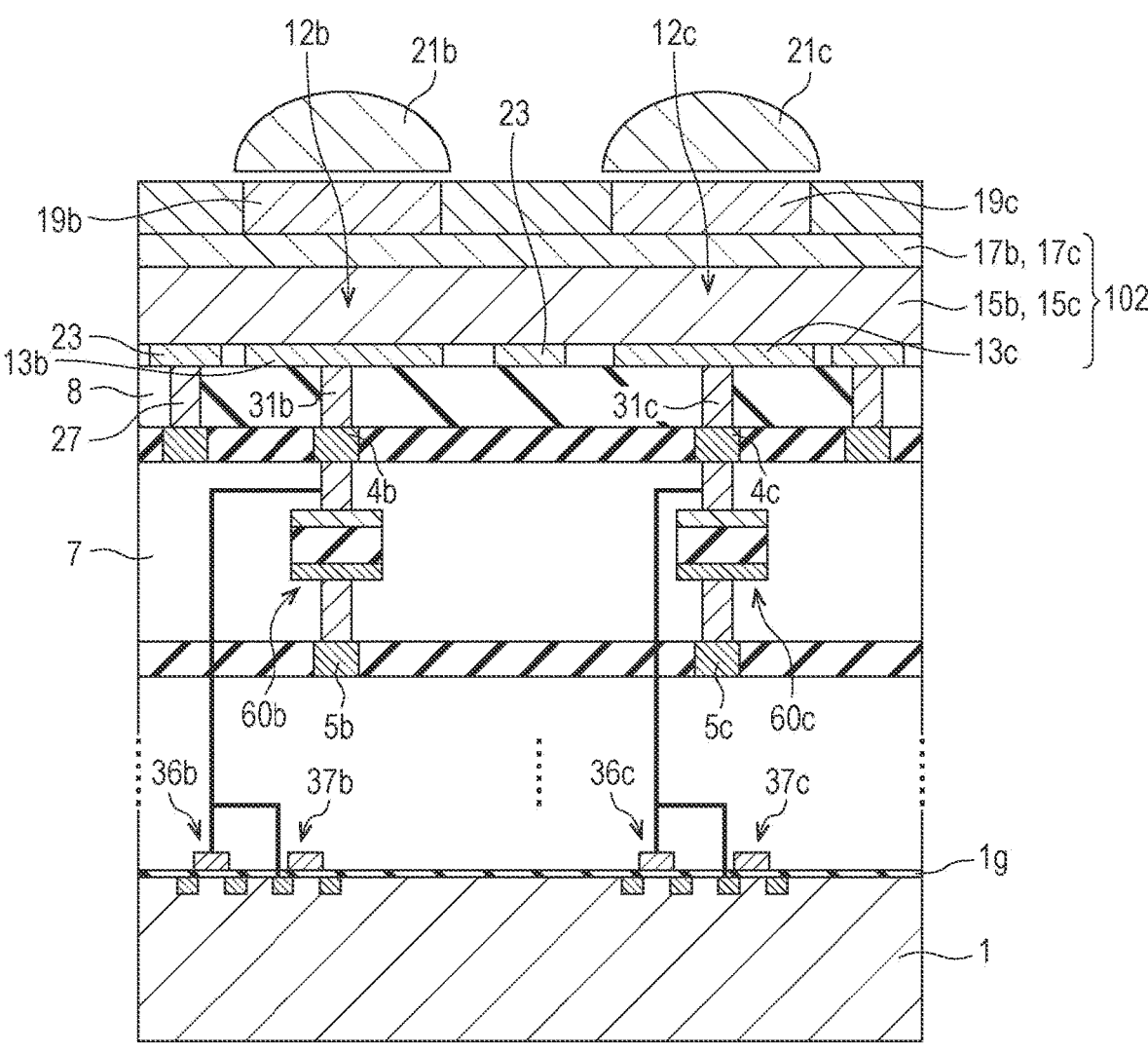
Figure 21:
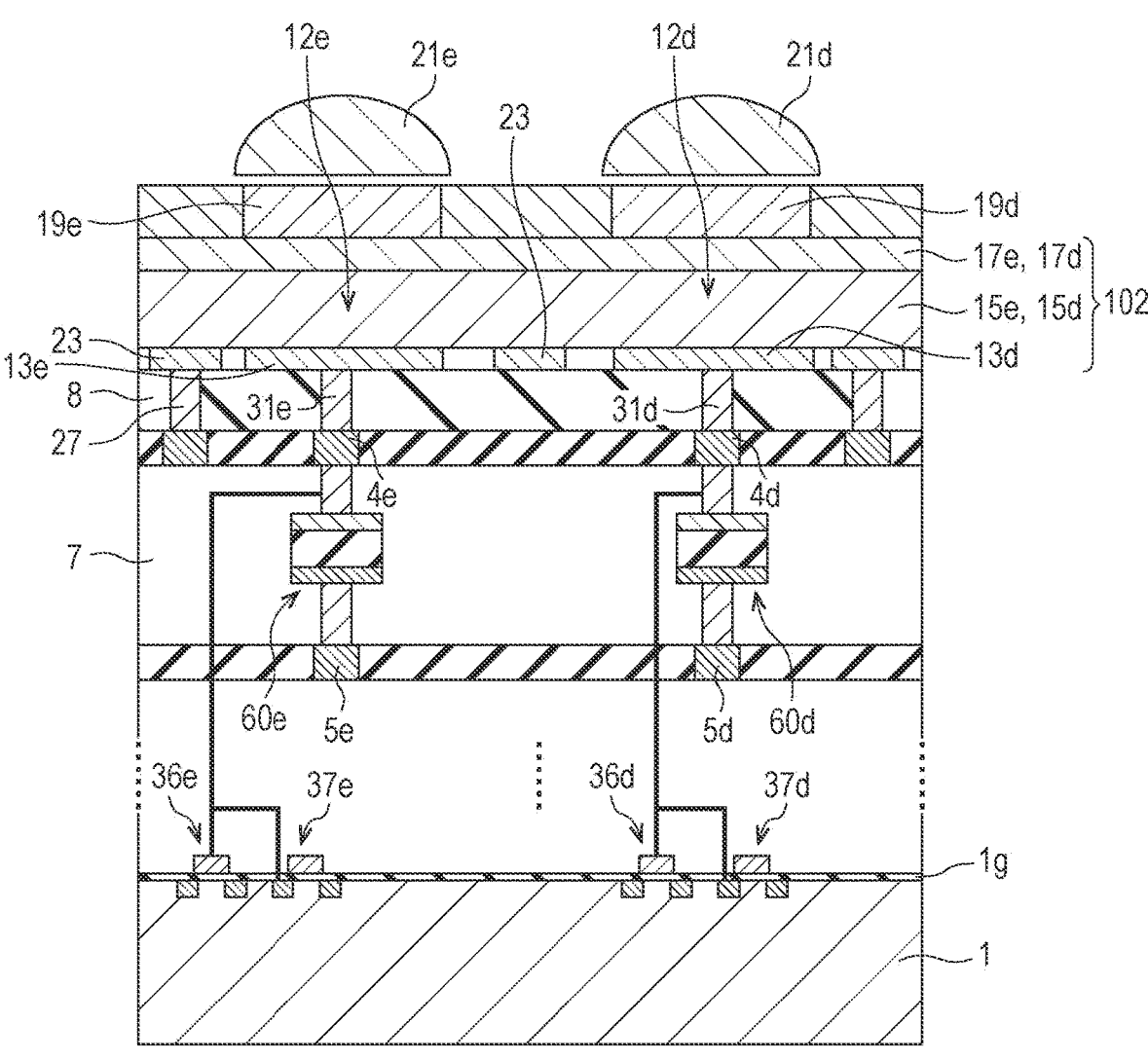
Figure 22:
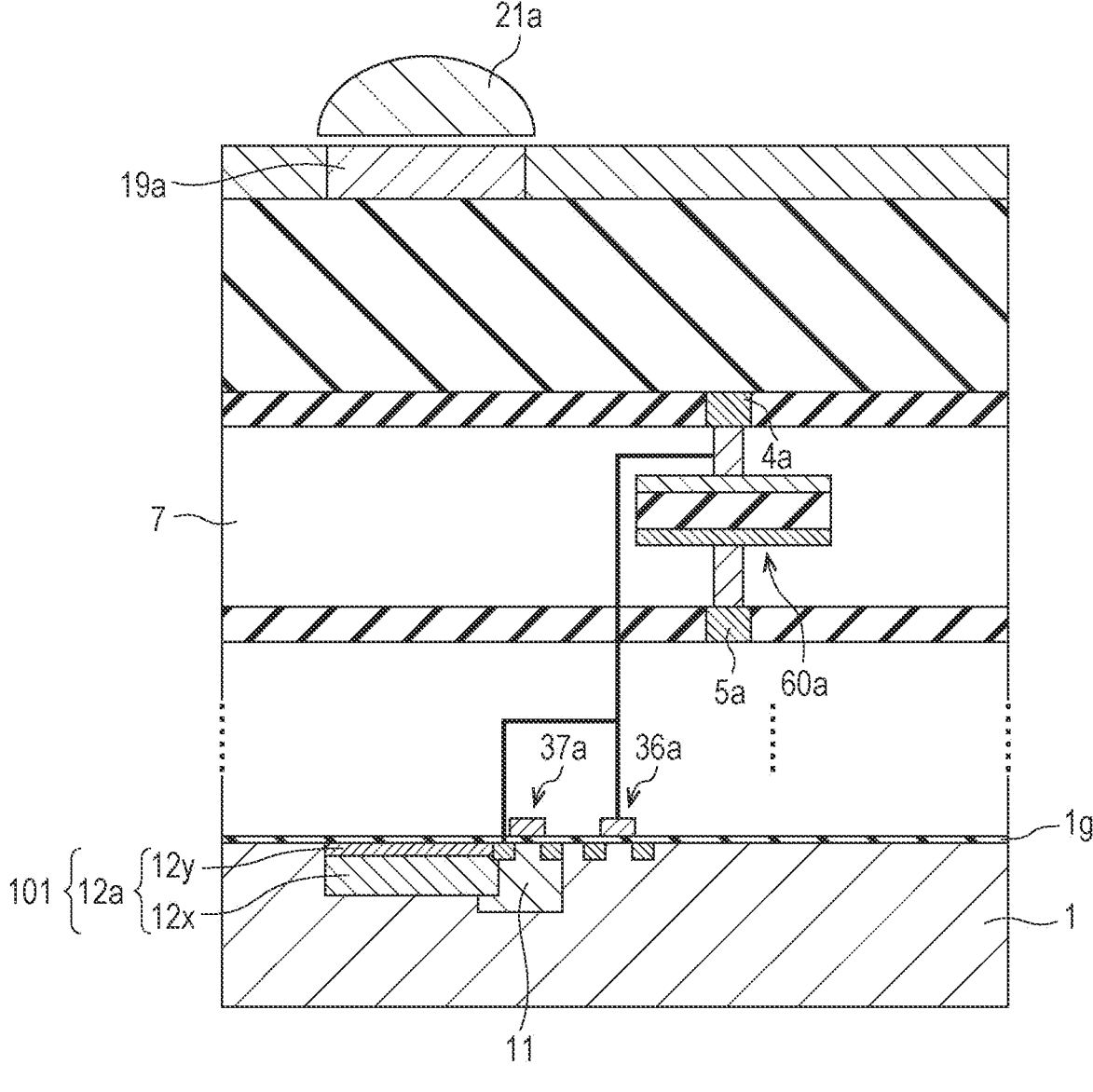
Figure 23:
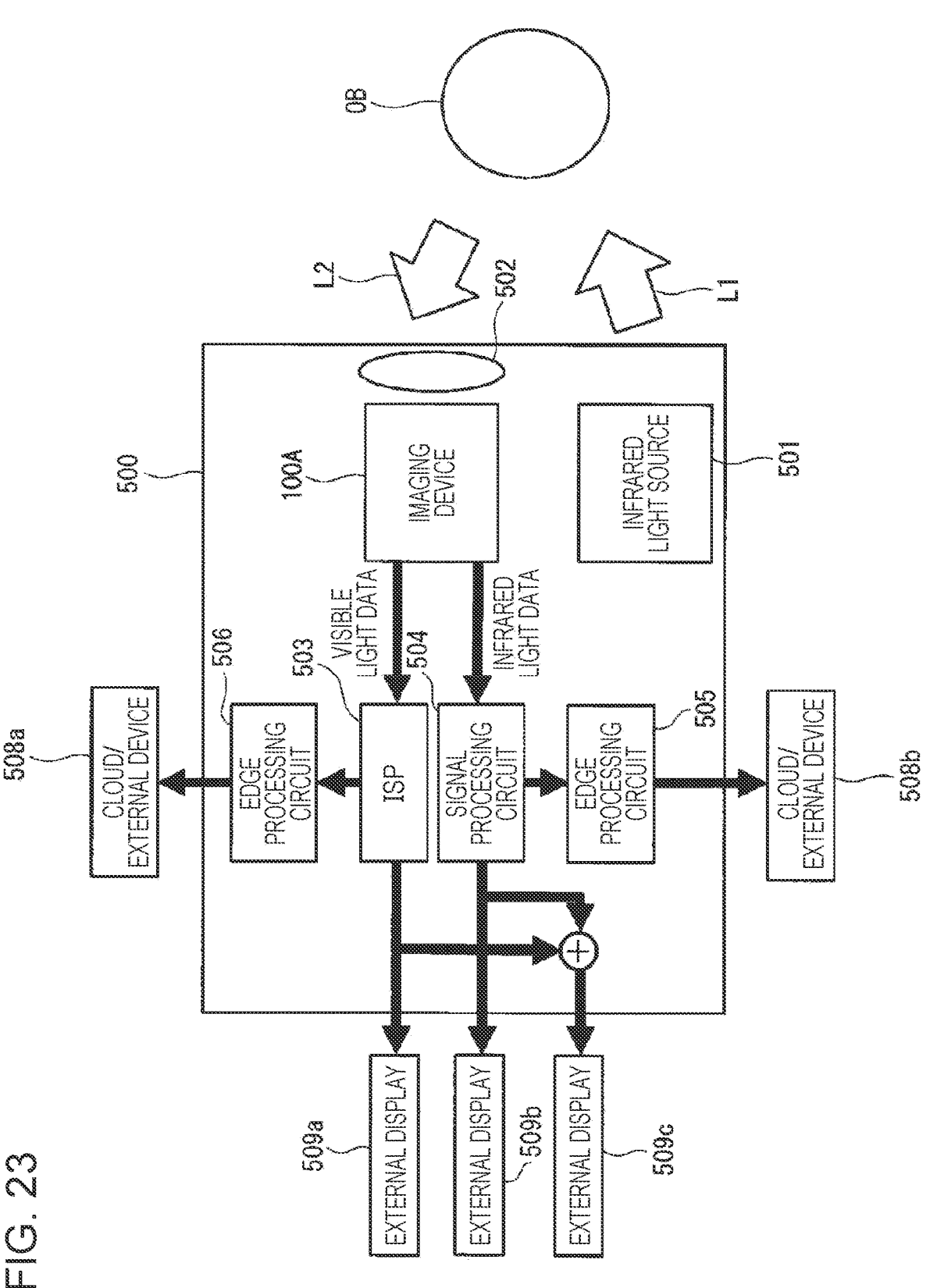

FIG. 4 is a circuit diagram of a circuit configuration according to the first embodiment;

FIG. 5 is a configuration diagram of a photoelectric converter according to the first embodiment;

FIG. 6 is a configuration diagram of a capacitive element according to the first embodiment;

FIG. 7 is a diagram for describing the areas of opposing surfaces;

FIG. 8 is a plan view of a plurality of pixel electrodes according to the first embodiment;

FIG. 9 is a plan view of a plurality of capacitive elements according to the first embodiment;

FIG. 10 is a diagram for describing a first capacitive element that has a rounded shape in a plan view;

FIG. 11 is a cross-sectional view of an imaging element according to the first embodiment, the view illustrating a first cross section;

FIG. 12 is a cross-sectional view of the imaging element according to the first embodiment, the view illustrating a second cross section;

FIG. 13 is a schematic diagram illustrating an imaging mode according to a reference embodiment;

FIG. 14 is a schematic diagram illustrating an imaging mode according to the first embodiment;

FIG. 15 is a plan view of a plurality of capacitive elements according to a second embodiment;

FIG. 16 is a cross-sectional view of an imaging element according to the second embodiment, the view illustrating a first cross section;

FIG. 17 is a cross-sectional view of the imaging element according to the second embodiment, the view illustrating a second cross section;

FIG. 18 is a cross-sectional view of an imaging element according to a third embodiment, the view illustrating a first cross section;

FIG. 19 is a cross-sectional view of the imaging element according to the third embodiment, the view illustrating a second cross section;

FIG. 20 is a cross-sectional view of an imaging element according to a fourth embodiment, the view illustrating a first cross section;

FIG. 21 is a cross-sectional view of the imaging element according to the fourth embodiment, the view illustrating a second cross section;

FIG. 22 is a cross-sectional view of the imaging element according to the fourth embodiment; and FIG. 23 is a block diagram illustrating the configuration of a camera system.

DETAILED DESCRIPTIONS

Summary of one Embodiment According to Present Disclosure

An imaging device according to a first aspect of the present disclosure includes a first photoelectric converter that converts light having a wavelength in a first wavelength region into first electric charge, a first capacitive element that accumulates the first electric charge and that includes a first electrode, a second electrode, and a first dielectric, the second electrode facing the first electrode, the first dielectric being arranged between the first electrode and the second electrode, a second photoelectric converter that is arranged at a different height from the first photoelectric converter in a thickness direction of the imaging device and that converts light having a wavelength in a second wavelength region into second electric charge, and a second capacitive element that accumulates the second electric charge and that includes a third electrode, a fourth electrode, and a second dielectric, the fourth electrode facing the third electrode, the second dielectric being arranged between the third electrode and the fourth electrode.

The imaging device may have a plurality of layers, and the second photoelectric converter may be arranged in a different layer from the first photoelectric converter among the plurality of layers.

The technology according to the first aspect is suitable for realization of a wide dynamic range.

In a second aspect of the present disclosure, for example, the imaging device according to the first aspect may further include a semiconductor substrate, and the first dielectric may have a higher permittivity than an oxide of a semiconductor material of the semiconductor substrate.

According to the second aspect, the capacitance of the first capacitive element is easily ensured.

In a third aspect of the present disclosure, for example, in the imaging device according to the first or second aspect, the first dielectric may have a thickness of greater than or equal to 10 nm and less than or equal to 45 nm.

According to the third aspect, both of the reliability and the capacitance of the first capacitive element are easily ensured.

In a fourth aspect of the present disclosure, for example, in the imaging device according to any one of the first to third aspects, the first capacitive element may have a metal-insulator-metal (MIM) structure.

According to the fourth aspect, the first capacitive element, which has high capacitance density, can be realized.

In a fifth aspect of the present disclosure, for example, in the imaging device according to any one of the first to fourth aspects, the first electrode may have a first opposing surface, the second electrode may have a second opposing surface, the third electrode may have a third opposing surface, the fourth electrode may have a fourth opposing surface, the first opposing surface and the second opposing surface may face each other, the third opposing surface and the fourth opposing surface may face each other, the first opposing surface may have a larger area than the third opposing surface, the second opposing surface may have a larger area than the fourth opposing surface, the first wavelength region may include a wavelength region of infrared light, and the second wavelength region may include a wavelength region of visible light.

According to the fifth aspect, the capacitance of the first capacitive element is easily made higher than that of the second capacitive element.

In a sixth aspect of the present disclosure, for example, in the imaging device according to any one of the first to fifth aspects, in a plan view, the first capacitive element and the second capacitive element may be superposed with each other.

According to the sixth aspect, both of the capacitance of the first capacitive element and that of the second capacitive element are easily ensured.

In a seventh aspect of the present disclosure, for example, the imaging device according to the sixth aspect may further include a third capacitive element, and in the plan view, the first capacitive element may be superposed with the second capacitive element and the third capacitive element.

According to the seventh aspect, the capacitance of the first capacitive element, that of the second capacitive element, and that of the third capacitive element are easily ensured.

In an eighth aspect of the present disclosure, for example, in the imaging device according to any one of the first to fifth aspects, the first capacitive element and the second capacitive element may be arranged at identical heights in the thickness direction of the imaging device. The first capacitive element and the second capacitive element may be arranged in the same layer among the plurality of layers.

The imaging device according to the eighth aspect is easily manufactured.

In a ninth aspect of the present disclosure, for example, the imaging device according to the eighth aspect may further include a third capacitive element, a fourth capacitive element, and a fifth capacitive element, and in a case where, in a plan view, a rectangle having a smallest area among a plurality of rectangles that contain the first capacitive element is defined as a reference rectangle, a straight line including one of two diagonals of the reference rectangle is defined as a first straight line, and a straight line including another one of the two diagonals is defined as a second straight line, in the plan view, the first straight line may pass through the second capacitive element, the first capacitive element, and the third capacitive element in this order, and in the plan view, the second straight line may pass through the fourth capacitive element, the first capacitive element, and the fifth capacitive element in this order.

The ninth aspect is advantageous from the viewpoint of symmetrically arranging the second capacitive element, the third capacitive element, the fourth capacitive element, and the fifth capacitive element and ensuring the area of each of these capacitive elements in a plan view.

In a tenth aspect of the present disclosure, for example, in the imaging device according to any one of the first to ninth aspects, the first wavelength region may include a wavelength region of infrared light, the second wavelength region may include a wavelength region of visible light, and the first capacitive element may have a higher capacitance than the second capacitive element.

The technology according to the tenth aspect is suitable for realization of a wide dynamic range regarding the first wavelength region.

In an eleventh aspect of the present disclosure, for example, in the imaging device according to any one of the first to tenth aspects, the first wavelength region may include a wavelength region of infrared light, the second wavelength region may include a wavelength region of visible light, the first photoelectric converter may include a first photoelectric conversion layer that generates the first electric charge, the first photoelectric converter may include a first pixel electrode that collects the first electric charge, the second photoelectric converter may include a second photoelectric conversion layer that generates the second electric charge, the second photoelectric converter may include a second pixel electrode that collects the second electric charge, and in a plan view, the first pixel electrode may have a larger area than the second pixel electrode.

According to the eleventh aspect, electric charge corresponding to the amount of light may be collected by the pixel electrodes.

The imaging device according to the eleventh aspect easily collects, using the first pixel electrode, the first electric charge even when light of the first wavelength region is low.

In a twelfth aspect of the present disclosure, for example, in the imaging device according to the eleventh aspect, the first photoelectric converter may further include a first counter electrode, the first photoelectric conversion layer may be arranged between the first counter electrode and the first pixel electrode, the second photoelectric converter may further include a second counter electrode, the second photoelectric conversion layer may be arranged between the second counter electrode and the second pixel electrode, and the first counter electrode and the second counter electrode may be electrically separated from each other.

According to the twelfth aspect, switching as to whether light of the first wavelength region is to be reflected in an image and switching as to whether light of the second wavelength region is to be reflected in an image can be performed independently of each other.

In a thirteenth aspect of the present disclosure, for example, in the imaging device according to any one of the first to twelfth aspects, in a case where, out of the first photoelectric converter and the second photoelectric converter, a photoelectric converter closer to a light receiving surface of the imaging device is defined as a proximal photoelectric converter, and a photoelectric converter farther from the light receiving surface is defined as a distal photoelectric converter, a central wavelength of a wavelength region of light that the proximal photoelectric converter photoelectrically converts may be shorter than a central wavelength of a wavelength region of light that the distal photoelectric converter photoelectrically converts.

Short wavelength light is more likely to be attenuated than long wavelength light. However, according to the thirteenth aspect, attenuation of short wavelength light can be reduced.

In a fourteenth aspect of the present disclosure, for example, the imaging device according to any one of the first to thirteenth aspects may further include a first reset transistor that has a gate and resets electric potential of the first capacitive element, and a second reset transistor that has a gate and resets electric potential of the second capacitive element, and the first reset transistor may have a larger gate width than the second reset transistor.

The configuration in the fourteenth aspect is an example of the configuration of the imaging device.

In a fifteenth aspect of the present disclosure, for example, the imaging device according to the first aspect may further include a plurality of unit pixels arranged in a matrix shape, each of the plurality of unit pixels may include the first photoelectric converter, the second photoelectric converter, a third photoelectric converter, the first capacitive element, the second capacitive element, and a third capacitive element, the first wavelength region may include a wavelength region of infrared light, the second wavelength region may include a wavelength region of first color light, the third photoelectric converter may convert second color light into third electric charge, and the third capacitive element may accumulate the third electric charge.

In a sixteenth aspect of the present disclosure, the first photoelectric converter may include a first photoelectric conversion layer that generates the first electric charge, the first photoelectric converter may include a first pixel electrode that collects the first electric charge, the second photoelectric converter may include a second photoelectric conversion layer that generates the second electric charge, the second photoelectric converter may include a second pixel electrode that collects the second electric charge, in a plan view, the first pixel electrode may have a larger area than the second pixel electrode, and the first capacitive element may have a higher capacitance than the second capacitive element.

In embodiments, words such as "above" and "below" are used to specify arrangement of members only in relation to one another in an imaging device and are not intended to limit the orientation of the imaging device when the imaging device is used. In the illustrated examples, "upward" and "downward" directions are determined with respect to a semiconductor substrate. A direction away from the semiconductor substrate is an upward direction. A direction toward the semiconductor substrate is a downward direction.

In the embodiments, a "plan view" refers to a view seen from the thickness direction of the semiconductor substrate.

In the embodiments, the wavelength region of visible light refers to a wavelength range of greater than or equal to 400 nm and less than 780 nm. The wavelength region of red light refers to a wavelength range of greater than or equal to 610 nm and less than 780 nm. The wavelength region of green light refers to a wavelength range of greater than or equal to 500 nm and less than 570 nm. The wavelength region of blue light refers to a wavelength range of greater than or equal to 460 nm and less than 500 nm. The wavelength region of infrared light refers to a wavelength range of greater than or equal to 780 nm and less than 2000 nm. The wavelength region of ultraviolet light refers to a wavelength range of greater than or equal to 200 nm and less than 400 nm. In the embodiments, "a certain wavelength region including a specific wavelength region" refers to the certain wavelength region including at least part of the specific wavelength region. For example, "the first wavelength region including the wavelength region of infrared light" refers to the first wavelength region including at least part of the wavelength region of infrared light.

In the embodiments, "have translucency" refers to the property of having a light transmittance of 40% or higher for a wavelength region of greater than or equal to 380 nm and less than or equal to 780 nm. This transmittance is based on the Japanese Industrial Standards (JIS) R1635 (1998). In a case where an electrode has translucency, visible light can pass through the electrode. Moreover, in this case, infrared light and ultraviolet light also tend to be more likely to pass through the electrode.

In the embodiments, "permittivity" corresponds to values at 25° C. and 100 Hz.

In the embodiments, "materials being the same" refers to elements used as the materials being the same and also the composition ratios of the elements being the same. "Materials being different" refers to not only a case where elements used as the materials are different but also a case where the composition ratios of the elements are different even though the elements used as the materials are the same.

In the embodiments, individual elements may be adjusted, as needed, due to change of positive-negative of signal charge such as change of the conductivity type of an impurity region. Moreover, terms may be read differently, as needed, due to change of positive-negative of signal charge.

In the embodiments, ordinal numerals such as first, second, and third may be used. In a case where an ordinal numeral is assigned to a certain element, an element of the same kind and having a smaller ordinal numeral does not have to be present. For example, use of a term such as a "second color filter" does not necessarily mean that a first color filter is present together with the second color filter every time. Moreover, an ordinal numeral may be changed to another ordinal numeral, an ordinal numeral may be removed, or an ordinal numeral may be added as needed.

Embodiments of the present disclosure will be described below with reference to the drawings. The present disclosure is not limited to the following embodiments.

First Embodiment

Figure 1:
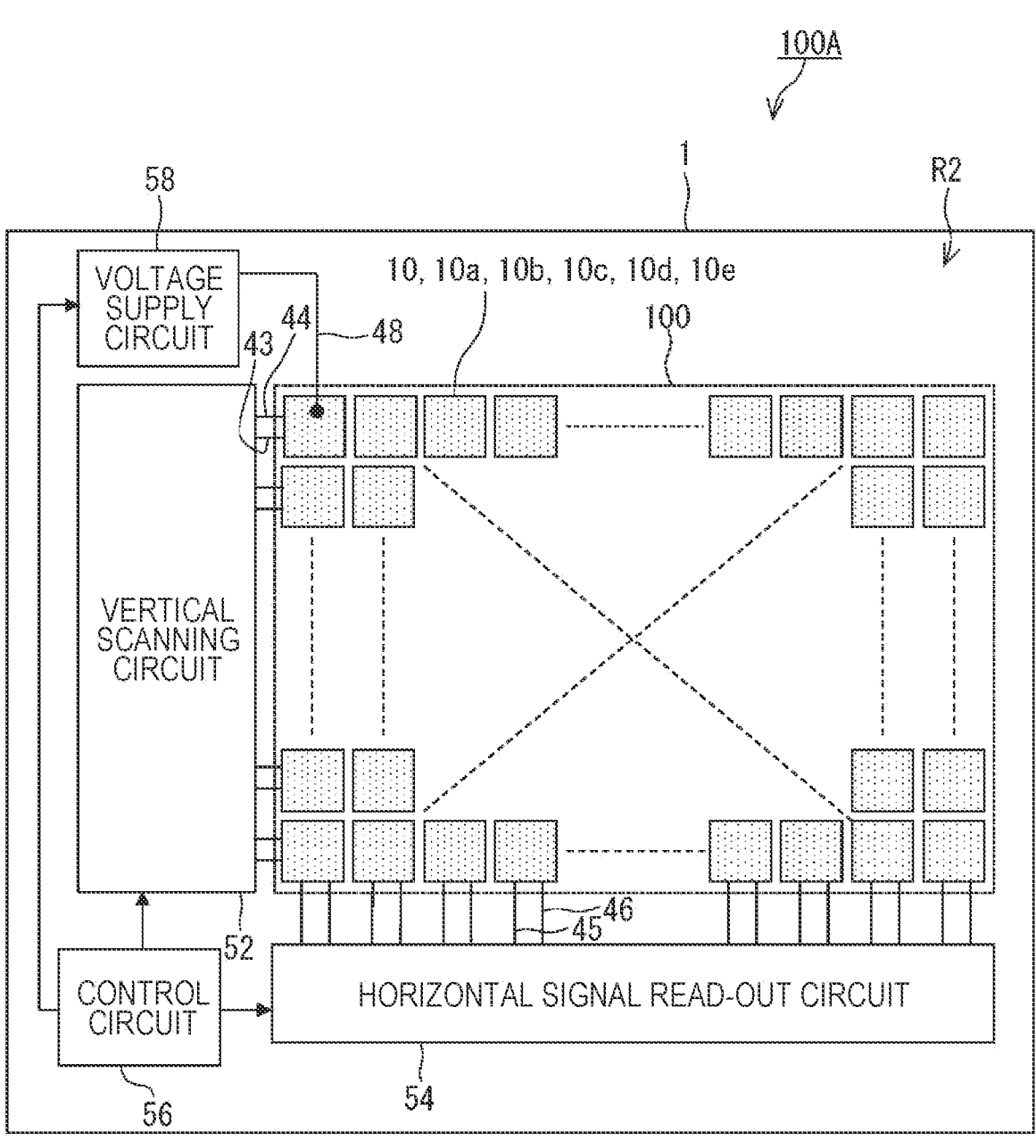
FIG. 1 is a configuration diagram of an imaging device according to a first embodiment.

FIG. 1 illustrates the configuration of an imaging device 100A according to a first embodiment of the present disclosure. The imaging device 100A includes an imaging element 100.

The imaging element 100 includes at least one unit pixel 10, which is formed using a semiconductor substrate 1. In the present embodiment, a plurality of unit pixels 10 are formed using the semiconductor substrate 1. The semiconductor substrate 1 is, for example, a silicon substrate.

In the present embodiment, each unit pixel 10 includes a first pixel 10a, a second pixel 10b, a third pixel 10c, a fourth pixel 10d, and a fifth pixel 10e. Note that the unit pixel 10 does not have to include all of these pixels. Moreover, the unit pixel 10 may include other pixels in addition to these pixels.

In the present embodiment, the central wavelengths of wavelength regions of light that the first pixel 10a, the second pixel 10b, the fourth pixel 10d, and the fifth pixel 10e photoelectrically convert are different from each other. In contrast, the central wavelengths of wavelength regions of light that the second pixel 10b and the third pixel 10c photoelectrically convert are equal to each other or have values close to each other.

The first pixel 10a is a pixel for generating data based on light of a first wavelength region. In the present embodiment, the first wavelength region includes the wavelength region of infrared light.

The second pixel 10b is a pixel for generating data based on light of a second wavelength region. In the present embodiment, the second wavelength region includes the wavelength region of visible light. Specifically, the second wavelength region includes the wavelength region of first color light. More specifically, the first color light is green light.

The third pixel 10c is a pixel for generating data based on light of a third wavelength region. In the present embodiment, the third wavelength region includes the wavelength region of visible light. Specifically, the third wavelength region includes the wavelength region of the first color light. More specifically, the first color light is green light.

The fourth pixel 10d is a pixel for generating data based on light of a fourth wavelength region. In the present embodiment, the fourth wavelength region includes the wavelength region of visible light. Specifically, the fourth wavelength region includes the wavelength region of second color light. More specifically, the second color light is red light.

The fifth pixel 10e is a pixel for generating data based on light of a fifth wavelength region. In the present embodiment, the fifth wavelength region includes the wavelength region of visible light. Specifically, the fifth wavelength region includes the wavelength region of third color light. More specifically, the third color light is blue light.

Data to be generated by the unit pixels 10 is typically image data. Images based on visible light can be obtained by the second pixels 10b, the third pixels 10c, the fourth pixels 10d, and the fifth pixels 10e. In the present embodiment, images based on visible light are full-color images. Note that images based on visible light may also be monochrome images. Images based on infrared light can be obtained by the first pixels 10a.

Each pixel in each unit pixel 10 includes a photoelectric converter. The photoelectric converter generates, upon receiving incident light, positive charge and negative charge. The photoelectric converter typically generates electron-hole pairs.

In FIG. 1, the unit pixels 10 are illustrated so as to be spatially separated from each other. Note that this is just for the sake of explanatory convenience. The plurality of unit pixels 10 may be continuously arranged so as not to have a spacing therebetween.

Similarly, the photoelectric converters of each unit pixel 10 may be arranged so as to be spatially separated from each other or may be continuously arranged so as not to have a spacing therebetween.

In FIG. 1, the unit pixels 10 are arranged in a plurality of rows (m rows) and a plurality of columns (n columns), where m and n are independent of each other and are integers greater than or equal to 1. The unit pixels 10 form an imaging region by being arranged, for example, two-dimensionally. When the imaging device 100A is viewed in a plan view, the imaging element 100 may be defined as a region where the photoelectric converters are present.

The number of unit pixels 10 and the layout of the unit pixels 10 are not specifically limited. In FIG. 1, the center of each unit pixel 10 is positioned at a grid point of a square grid. The plurality of unit pixels 10 may be arranged such that the center of each unit pixel 10 is positioned at a grid point of, for example, a triangular grid, a hexagonal grid, or the like. The imaging element 100 may be used as a line sensor that is obtained by arranging the unit pixels 10 one-dimensionally.

In the present embodiment, the number of pixels is equal to the number of photoelectric converters. In the present embodiment, the number of pixels is equal to the number of amplification transistors. In the present embodiment, each pixel has one pixel electrode. Thus, the number of pixels is equal to the number of pixel electrodes.

In the imaging device 100A, a peripheral circuit is formed using the semiconductor substrate 1.

The peripheral circuit includes a vertical scanning circuit 52, a horizontal signal read-out circuit 54, a control circuit 56, and a voltage supply circuit 58. The peripheral circuit may further include a signal processing circuit, an output circuit, and so forth. Each circuit is formed using the semiconductor substrate 1. The unit pixels 10 may be formed using the semiconductor substrate 1, and part or the entirety of the peripheral circuit may be formed using another substrate.

In the present embodiment, the first pixels 10a are arranged in a matrix shape. The same applies to the second pixels 10b, the third pixels 10c, the fourth pixels 10d, and the fifth pixels 10e.

The matrix of the first pixels 10a is associated with the vertical scanning circuit 52 and the horizontal signal read-out circuit 54. The same applies to the matrix of the second pixels 10b, that of the third pixels 10c, that of the fourth pixels 10d, and that of the fifth pixels 10e. The vertical scanning circuit 52 is also referred to as a row scanning circuit. The horizontal signal read-out circuit 54 is also referred to as a column scanning circuit.

Regarding the plurality of rows of the first pixels 10a, address signal lines 44 are provided so as to correspond to the respective rows, and the address signal lines 44 are connected to the vertical scanning circuit 52. Regarding the plurality of rows of the first pixels 10a, reset signal lines 43 are provided so as to correspond to the respective rows, and the reset signal lines 43 are connected to the vertical scanning circuit 52. The vertical scanning circuit 52 outputs a predetermined voltage to the address signal lines 44 to select, on a row basis, the first pixels 10a arranged in the rows. As a result, signal voltages are read out from the selected first pixels 10a, and the pixel electrodes are reset. In these respects, the same applies to the second pixels 10b, the third pixels 10c, the fourth pixels 10d, and the fifth pixels 10e.

Regarding the plurality of columns of the first pixels 10a, vertical signal lines 45 are provided so as to correspond to the respective columns, and the vertical signal lines 45 are connected to the horizontal signal read-out circuit 54. Regarding the plurality of columns of the first pixels 10a, feedback lines 46 are provided so as to correspond to the respective columns, and the feedback lines 46 are connected to the horizontal signal read-out circuit 54. In these respects, the same applies to the second pixels 10b, the third pixels 10c, the fourth pixels 10d, and the fifth pixels 10e.

The address signal lines 44 provided so as to correspond to the respective rows of the plurality of first pixels 10a can be referred to as first address signal lines 44. The reset signal lines 43 provided so as to correspond to the respective rows of the plurality of first pixels 10a can be referred to as first reset signal lines 43. The vertical signal lines 45 provided so as to correspond to the respective columns of the plurality of first pixels 10a can be referred to as first vertical signal lines 45. The feedback lines 46 provided so as to correspond to the respective columns of the plurality of first pixels 10a can be referred to as first feedback lines 46. Description can also be valid that is obtained by changing, in these descriptions, an ordinal numeral of "first" to "second" and changing "a" to "b" at the ends of the reference symbols. Description can also be valid that is obtained by changing, in these descriptions, an ordinal numeral of "first" to "third" and changing "a" to "c" at the ends of the reference symbols. Description can also be valid that is obtained by changing, in these descriptions, an ordinal numeral of "first" to "fourth" and changing "a" to "d" at the ends of the reference symbols. Description can also be valid that is obtained by changing, in these descriptions, an ordinal numeral of "first" to "fifth" and changing "a" to "e" at the ends of the reference symbols.

Signal lines provided so as to correspond to the individual rows of the plurality of first pixels 10a are not limited to the first address signal lines 44 and the first reset signal lines 43. Regarding each of the rows of the first pixels 10a, signal lines of other kinds may be connected to the vertical scanning circuit 52. Signal lines provided so as to correspond to the individual columns of the plurality of first pixels 10a are not limited to the first vertical signal lines 45 and the first feedback lines 46. Regarding each of the columns of the first pixels 10a, signal lines of other kinds may be connected to the horizontal signal read-out circuit 54. In these respects, the same applies to the second pixels 10b, the third pixels 10c, the fourth pixels 10d, and the fifth pixels 10e.

In FIG. 1, from the point of view of drawing simplification, one address signal line 44 is illustrated for each row of the unit pixels 10. One reset signal line 43 is illustrated for each row of the unit pixels 10. One vertical signal line 45 is illustrated for each column of the unit pixels 10. One feedback line 46 is illustrated for each column of the unit pixels 10.

The control circuit 56 controls the entirety of the imaging device 100A by receiving command data input from outside the imaging device 100A, a clock signal, or the like. Typically, the control circuit 56 has a timing generator and supplies a driving signal to the vertical scanning circuit 52, the horizontal signal read-out circuit 54, the voltage supply circuit 58, and so forth. The control circuit 56 may be realized by, for example, a microcontroller including one or more processors. The functions of the control circuit 56 may be realized using a combination of a general-purpose processing circuit and software or using hardware specific to such processing.

The voltage supply circuit 58 supplies a predetermined voltage to each pixel of each unit pixel 10 via a power wiring line 48. The voltage supply circuit 58 is not limited to a specific power supply circuit. The voltage supply circuit 58 may be a circuit that converts a voltage supplied from a power source such as a battery into a predetermined voltage, or may also be a circuit that generates a predetermined voltage. The voltage supply circuit 58 may also be part of the vertical scanning circuit 52 described above. These circuits constituting the peripheral circuit may be arranged in a peripheral region R2 outside the imaging element 100.

Figure 2:
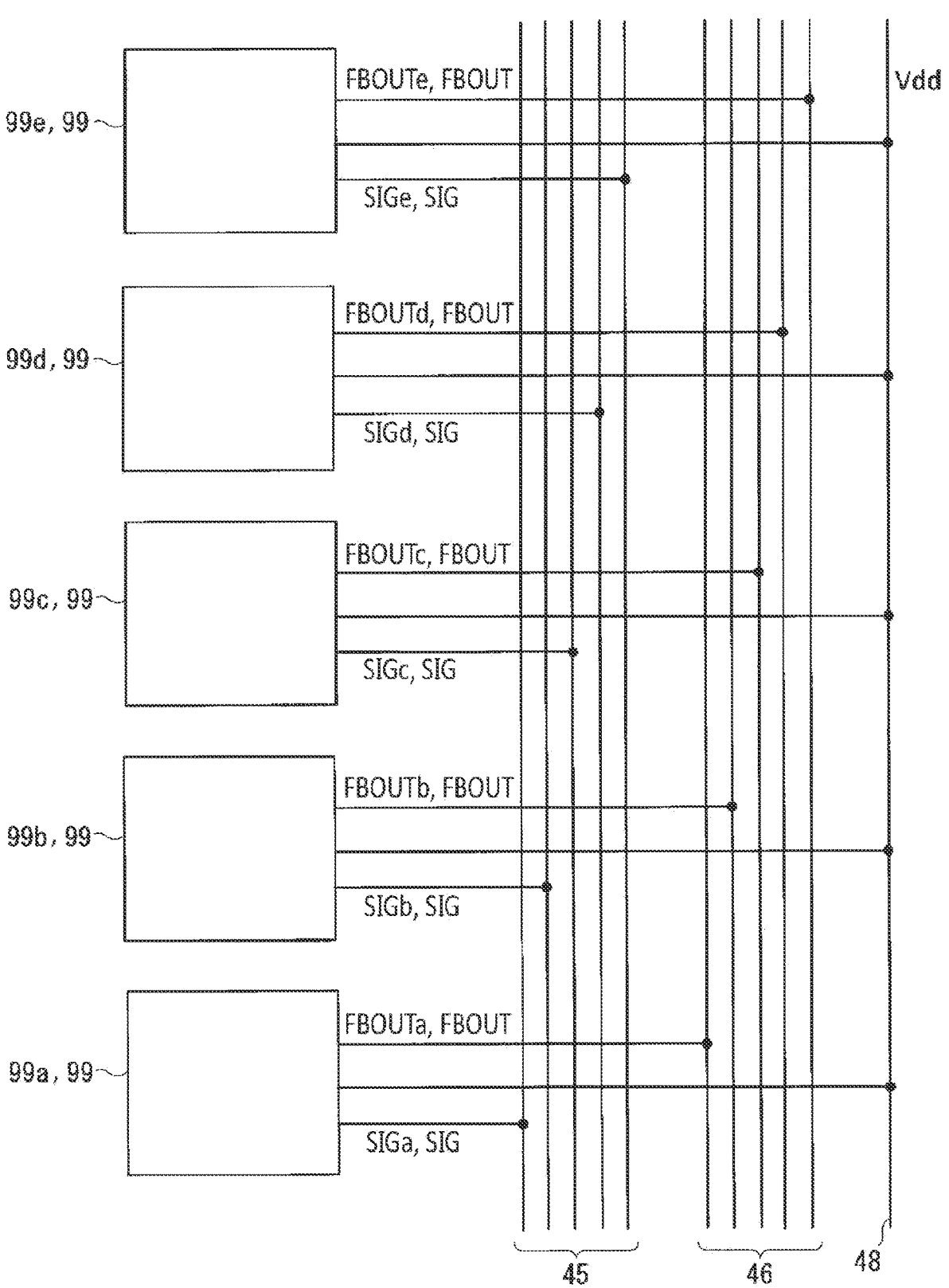
FIG. 2 is a circuit diagram of a unit pixel according to the first embodiment.

FIG. 2 illustrates a circuit diagram of the unit pixel 10. Each of the first pixel 10a, the second pixel 10b, the third pixel 10c, the fourth pixel 10d, and the fifth pixel 10e has a circuit configuration 99.

A predetermined power supply voltage Vdd is supplied from the power wiring line 48 to the circuit configuration 99 of each pixel. The power supply voltage Vdd is, for example, about 3.3 V. An output signal SIG is output from the circuit configuration 99 of each pixel to a vertical signal line 45 corresponding to the column to which the pixel belongs. A feedback signal FBOUT is supplied to the circuit configuration 99 of each pixel from a feedback line 46 corresponding to the column to which the pixel belongs.

Figure 3:
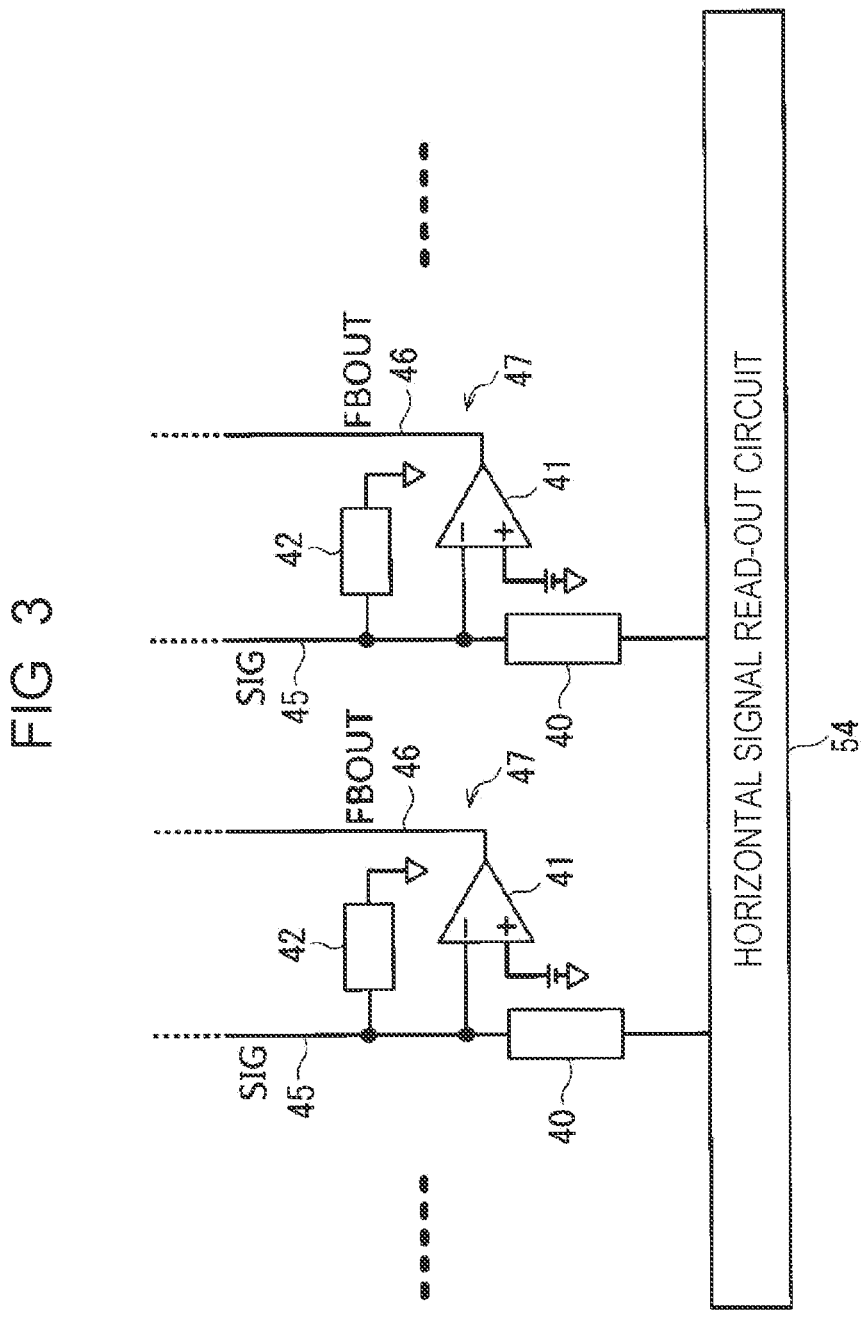
FIG. 3 is a circuit diagram for describing feedback.

FIG. 3 is a circuit diagram for describing feedback regarding each pixel. FIG. 3 illustrates part of a peripheral circuit. The peripheral circuit includes a plurality of load circuits 42, a plurality of column signal processing circuits 40, and a plurality of inverting amplifiers 41.

The plurality of load circuits 42, the plurality of column signal processing circuits 40, and the plurality of inverting amplifiers 41 are divided into groups, each of which includes one of the load circuits 42, one of the column signal processing circuits 40, and one of the inverting amplifiers 41. Each column of the first pixels 10*a* is provided with one of the groups. Each column of the second pixels 10*b* is provided with one of the groups. Each column of the third pixels 10*c* is provided with one of the groups. Each column of the fourth pixels 10*d* is provided with one of the groups. Each column of the fifth pixels 10*e* is provided with one of the groups. For each column, the load circuit 42, the column signal processing circuit 40, and the inverting amplifier 41 are connected to the vertical signal line 45.

The column signal processing circuits 40 may also be referred to as row signal accumulation circuits. The inverting amplifiers 41 may also be referred to as feedback amplifiers.

The column signal processing circuits 40 perform, for example, noise reduction signal processing and analog-to-digital (AD) conversion. Noise reduction signal processing is, for example, correlated double sampling. The horizontal signal read-out circuit 54 is connected to the column signal processing circuits 40. The horizontal signal read-out circuit 54 sequentially reads out output signals SIG from each column signal processing circuit 40 to a horizontal common signal line, which is not illustrated.

The negative input terminals of the inverting amplifiers 41 are connected to the vertical signal lines 45. A predetermined voltage is supplied to the positive input terminals of the inverting amplifiers 41. The predetermined voltage is, for example, 1 V or a positive voltage near 1 V. Moreover, the output terminals of the inverting amplifiers 41 are connected to the feedback lines 46.

The load circuits 42 provided so as to correspond to the respective columns of the first pixels 10*a* can be referred to as first load circuits 42. The column signal processing circuits 40 provided so as to correspond to the respective columns of the first pixels 10*a* can be referred to as first column signal processing circuits 40. The inverting amplifiers 41 provided so as to correspond to the respective columns of the first pixels 10*a* can be referred to as first inverting amplifiers 41. The circuit configurations 99 of the first pixels 10*a* may be referred to as first circuit configurations 99*a*. The output signals SIG output from the first circuit configurations 99*a* of the first pixels 10*a* to the vertical signal lines 45 corresponding to the columns to which the first pixels 10*a* belong can be referred to as first output signals SIGa. The feedback signals FBOUT supplied to the first circuit configurations 99*a* of the first pixels 10*a* from the feedback lines 46 corresponding to the columns to which the first pixels 10*a* belong can be referred to as first feedback signals FBOUTa. Description can also be valid that is obtained by changing, in these descriptions, an ordinal numeral of "first" to "second" and changing "a" to "b" at the ends of the reference symbols. Description can also be valid that is obtained by changing, in these descriptions, an ordinal numeral of "first" to "third" and changing "a" to "c" at the ends of the reference symbols. Description can also be valid that is obtained by changing, in these descriptions, an ordinal numeral of "first" to "fourth" and changing "a" to "d" at the ends of the reference symbols. Description can also be valid that is obtained by changing, in these descriptions, an ordinal numeral of "first" to "fifth" and changing "a" to "e" at the ends of the reference symbols. For example, the above description regarding the first pixels 10*a*, the first circuit configurations 99*a*, the first output signals SIGa, and the first feedback signals FBOUTa similarly applies to second circuit configurations 99*b*, second output signals SIGb, and second feedback signals FBOUTb corresponding to the second pixels 10*b*, third circuit configurations 99*c*, third output signals SIGc, and third feedback signals FBOUTc corresponding to the third pixels 10*c*, fourth circuit configurations 99*d*, fourth output signals SIGd, and fourth feedback signals FBOUTd corresponding to the fourth pixels 10*d* as well as fifth circuit configurations 99*e*, fifth output signals SIGe, and fifth feedback signals FBOUTe corresponding to the fifth pixels 10*e*.

As is understood from the above description using FIG. 3, the first output signals SIGa are output from the first pixels 10*a* to the first vertical signal lines 45. The first output signals SIGa are input to the negative input terminals of the first inverting amplifiers 41. The first feedback signals FBOUTa are supplied from the output terminals of the first inverting amplifiers 41 to the first pixels 10*a* via the first feedback lines 46. In this manner, feedback circuits 47 for the first pixels 10*a* are formed, the feedback circuits 47 negatively feeding back the first output signals SIGa to the first pixels 10*a*. Each first inverting amplifier 41 is part of a corresponding one of the feedback circuits 47. Description can also be valid that is obtained by changing, in these descriptions, an ordinal numeral of "first" to "second" and changing "a" to "b" at the ends of the reference symbols. Description can also be valid that is obtained by changing, in these descriptions, an ordinal numeral of "first" to "third" and changing "a" to "c" at the ends of the reference symbols. Description can also be valid that is obtained by changing, in these descriptions, an ordinal numeral of "first" to "fourth" and changing "a" to "d" at the ends of the reference symbols. Description can also be valid that is obtained by changing, in these descriptions, an ordinal numeral of "first" to "fifth" and changing "a" to "e" at the ends of the reference symbols.

FIG. 4 illustrates a circuit diagram of the circuit configuration 99 in each of the first pixels 10*a*, the second pixels 10*b*, the third pixels 10*c*, the fourth pixels 10*d*, and the fifth pixels 10*e*.

The circuit configuration 99 includes a photoelectric converter 12, an address transistor 35, an amplification transistor 36, a reset transistor 37, and a capacitive element 60.

In the present embodiment, the address transistor 35, the amplification transistor 36, and the reset transistor 37 are metal oxide semiconductor field-effect transistors (MOSFETs). Note that these transistors may be transistors of different types from MOSFETs. Examples of the transistors include bipolar transistors.

Specifically, in the present embodiment, the photoelectric converter 12 generates positive charge as signal charge. Specifically, this positive charge is positive holes. The address transistor 35, the amplification transistor 36, and the reset transistor 37 are n-channel MOSFETs.

In another example, the photoelectric converter 12 generates negative charge as signal charge. Specifically, this negative charge is electrons. The address transistor 35, the amplification transistor 36, and the reset transistor 37 are p-channel MOSFETs.

In the present embodiment, the address transistor 35 includes a source, a drain, a gate electrode, and a gate insulating film. The gate insulating film is interposed between the semiconductor substrate 1 and the gate electrode. The gate insulating film of the address transistor 35 is part of an insulating layer 1*g*, which is illustrated in FIGS. 11 and 12 to be described later. In these respects, the same also applies to the amplification transistor 36 and the reset transistor 37. The insulating layer 1*g* is provided on the surface of the semiconductor substrate 1. In a typical example, the insulating layer 1g is an oxide of a semiconductor material of the semiconductor substrate 1.

The photoelectric converter 12, one of the source or the drain of the reset transistor 37, one end of the capacitive element 60, and the gate electrode of the amplification transistor 36 are electrically connected to each other. The other one of the source or the drain of the reset transistor 37 is electrically connected to the feedback line 46. One of the source or the drain of the amplification transistor 36 is electrically connected to the power wiring line 48. The other one of the source or the drain of the amplification transistor 36 is electrically connected to one of the source or the drain of the address transistor 35. The other one of the source or the drain of the address transistor 35 is electrically connected to the vertical signal line 45.

FIG. 5 illustrates the configuration of the photoelectric converter 12 according to the present embodiment. In the present embodiment, the photoelectric converter 12 is arranged outside the semiconductor substrate 1. Specifically, the entirety of the photoelectric converter 12 is arranged outside the semiconductor substrate 1. In the present embodiment, the photoelectric converter 12 is arranged above the semiconductor substrate 1.

The photoelectric converter 12 includes a pixel electrode 13, a counter electrode 17, and a photoelectric conversion layer 15. The photoelectric conversion layer 15 is arranged between the counter electrode 17 and the pixel electrode 13. The photoelectric conversion layer 15 generates electric charge through photoelectric conversion. The pixel electrode 13 collects the electric charge.

In the present embodiment, the counter electrode 17 is a transparent electrode. The transparent electrode is composed of a transparent conducting oxide such as indium tin oxide (ITO).

In the present embodiment, the photoelectric conversion layer 15 is composed of a photoelectric conversion material. The photoelectric conversion material is typically an organic material. Note that the photoelectric conversion material may be an inorganic material such as amorphous silicon. The photoelectric conversion material may also be quantum dots.

In the present embodiment, the photoelectric conversion layer 15 contains a donor material and an acceptor material. When the photoelectric conversion layer 15 is irradiated with light, electric charge is generated in the donor material, and carrier separation occurs. This carrier moves from the donor material to the acceptor material and passes through the acceptor material, and the electrode receives the carrier. Photoelectric conversion is achieved in this manner.

Specifically, in the present embodiment, an electric field is applied between the pixel electrode 13 and the counter electrode 17, that is, the photoelectric conversion layer 15. As a result, electrons are transported toward the positive electrode, and holes are transported toward the negative electrode. In this manner, ON-OFF of the photoelectric conversion function can be controlled by the voltage applied between the electrodes.

Typically, a voltage is applied to the counter electrode 17 from an external power supply, which is not illustrated. As a result, an electric field is applied between the pixel electrode 13 and the counter electrode 17.

A blocking layer that prevents electric charge from flowing to the pixel electrode 13 in a dark period may be provided between the pixel electrode 13 and the photoelectric conversion layer 15.

FIG. 6 illustrates the configuration of the capacitive element 60 according to the present embodiment. In the present embodiment, the capacitive element 60 is arranged outside the semiconductor substrate 1. Specifically, the entirety of the capacitive element 60 is arranged outside the semiconductor substrate 1. Note that the capacitive element 60 may be arranged within the semiconductor substrate 1.

In the present embodiment, specifically, the capacitive element 60 is arranged in an insulating layer. The insulating layer corresponds to an insulating layer 7 illustrated in FIGS. 11 and 12.

The present embodiment is described under the concept that a capacitive element does not contain the parasitic capacitance of a diffusion region or the like. That is, the capacitive element 60, which is not a parasitic capacitor, accumulates electric charge generated by the photoelectric converter 12. When the capacitive element 60, which is not a parasitic capacitor, is used, its capacitance is easily ensured.

In the present embodiment, the capacitive element 60 has an electrode 61 and an electrode 62. A dielectric 63 is arranged between the electrode 61 and the electrode 62. With such a configuration, the capacitance of the capacitive element 60 is easily ensured, and a large amount of electric charge is easily accumulated in the capacitive element 60. That is, with such a configuration, the capacitive element 60 having a high saturated charge amount is realized, and a wide dynamic range regarding the wavelength region of light that the photoelectric converter 12 photoelectrically converts is easily achieved.

Specifically, the electrode 61 has an opposing surface 65. The electrode 62 has an opposing surface 66. The opposing surface 65 and the opposing surface 66 face each other. The dielectric 63 is arranged between the opposing surface 65 and the opposing surface 66.

The dielectric 63 of the capacitive element 60 may be an insulator. Moreover, the dielectric 63 of the capacitive element 60 may have a film shape. That is, the dielectric 63 of the capacitive element 60 may be an insulating film.

In the present embodiment, the permittivity of the dielectric 63 is higher than the permittivity of the oxide of the semiconductor material of the semiconductor substrate 1. With this configuration, the capacitance of the capacitive element 60 is easily ensured. In the example illustrated in FIGS. 11 and 12 to be described later, the insulating layer 1g provided on the surface of the semiconductor substrate 1 may correspond to the oxide of the semiconductor material of the semiconductor substrate 1. Note that the expression "the permittivity of the dielectric 63 is higher than the permittivity of the oxide of the semiconductor material of the semiconductor substrate 1" does not intend to mean that the oxide has to be present in the imaging element 100.

In the present embodiment, the permittivity of the dielectric 63 is higher than that of silicon oxide. The permittivity of the dielectric 63 is higher than that of silicon nitride. The permittivity of the dielectric 63 is higher than that of the insulating layer 7, that of an insulating layer 8, and that of an insulating layer 9. The insulating layers 7, 8, and 9 will be described later.

An example of a material of the dielectric 63 is a high-k material. An example of the high-k material is a metal oxide. Examples of the metal oxide include hafnium oxide ($HfO_2$) and zirconia ($ZrO_2$). When the material of the dielectric 63 is a high-k material, the capacitance of the capacitive element 60 is easily ensured even when the opposing surface 65 and the opposing surface 66 have small areas.

A merit in using a high-k material as a material of the dielectric 63 will be further described. Suppose that silicon oxide is used as a material of the dielectric 63. In this case, even when the capacitive element 60 is formed which has a three-dimensional structure obtained by bending the opposing surface 65 and the opposing surface 66, it is not easy to ensure the capacitance of the capacitive element 60. In order to facilitate achievement of a higher degree of integration in an imaging element, there is a limit to how much the degree of integration can be increased only through changing the structure of the capacitive element 60. In this regard, it is easier to realize the capacitive element 60, which has a small area and a high capacitance, in a case where a material having high permittivity such as a high-k material is used as a material of the dielectric 63 than in a case where silicon oxide is used as a material of the dielectric 63.

Note that silicon oxide may be used as a material of the dielectric 63. Another example of a material of the dielectric 63 is silicon nitride. The dielectric 63 may be a composite film of silicon oxide and silicon nitride.

The dielectric 63 has, for example, a thickness of greater than or equal to 10 nm and less than or equal to 45 nm. When the dielectric 63 is excessively thin, the capacitive element 60 tends to have insufficient withstand voltage. When manufacturing variations and the like are also taken into consideration, it can be said that the reliability of the capacitive element 60 is ensured by using the dielectric 63 having a reasonable thickness. In contrast, when the dielectric 63 is excessively thick, it is difficult to ensure the capacitance of the capacitive element 60. In this regard, when the thickness of the dielectric 63 is in the range of greater than or equal to 10 nm and less than or equal to 45 nm, both of the reliability and capacitance of the capacitive element 60 are easily ensured. The thickness of the dielectric 63 may be greater than or equal to 15 nm and less than or equal to 45 nm or may be greater than or equal to 20 nm and less than or equal to 40 nm. In one numerical example, the thickness of the dielectric 63 is 30 nm.

Examples of a material of the electrode 61 include metals, metal compounds, and polysilicon. The electrode 61 may be part of the semiconductor substrate 1. Examples of the metal compounds include a metal nitride and a metal oxide. Examples of the metal nitride include titanium nitride (TiN) and tantalum nitride (TaN). Examples of the metal oxide include ITO.

When the material of the electrode 61 is titanium nitride or tantalum nitride, the surface roughness of the electrode 61 is easily reduced. As a result, the dielectric 63 is less likely to become locally thin due to unevenness of the electrode 61, so that current leakage is less likely to occur in the dielectric 63.

As a material of the electrode 62, materials that can be used as a material of the electrode 61 can be used. The material of the electrode 62 may be the same as or different from the material of the electrode 61.

The electrode 61 has, for example, a thickness of greater than or equal to 5 nm and less than or equal to 45 nm. The thickness of the electrode 61 may be, for example, greater than or equal to 10 nm and less than or equal to 40 nm. In one numerical example, the thickness of the electrode 61 is 30 nm.

As the thickness of the electrode 62, thicknesses that can be used as the thickness of the electrode 61 can be used. The thickness of the electrode 62 may be equal to or different from the thickness of the electrode 61.

The sheet resistance of the electrode 61 is, for example, less than or equal to $10000\Omega/\square$ and may be less than or equal to $1000\Omega/\square$. The sheet resistance of the electrode 61 is, for example, greater than or equal to $5\Omega/\square$ and may be greater than or equal to $50\Omega/\square$.

As the sheet resistance of the electrode 62, sheet resistances that can be used as the sheet resistance of the electrode 61 can be used. The sheet resistance of the electrode 62 may be equal to or different from the sheet resistance of the electrode 61.

The area of the opposing surface 65 is, for example, greater than or equal to $1\times10^4$ nm$^2$ and less than or equal to $1\times10^8$ nm$^2$ and may be greater than or equal to $5\times10^4$ nm$^2$ and less than or equal to $1\times10^7$ nm$^2$.

As the area of the opposing surface 66, areas that can be used as the area of opposing surface 65 can be used. The area of the opposing surface 66 may be equal to or different from the area of the opposing surface 65.

In the following, the area of the opposing surface 65 and the area of the opposing surface 66 will be described. FIG. 7 is a diagram for describing the area of the opposing surface 65 and the area of the opposing surface 66. FIG. 7 schematically illustrates only the opposing surface 65 and the opposing surface 66. Although not illustrated, the dielectric 63 is present between the opposing surface 65 and the opposing surface 66. In the example illustrated in FIG. 7, the opposing surface 65 is bent. Specifically, the opposing surface 65 has a plane P1, a plane P2, a plane P3, a plane P4, and a plane P5. In the example illustrated in FIG. 7, the area of the opposing surface 65 is the total of the areas of the planes P1, P2, P3, P4, and P5. In this manner, in a case where the opposing surface 65 is bent, the area of the opposing surface 65 refers not to the area of the opposing surface 65 that is seen in a plan view but to the area of the opposing surface 65 that is bent and extends. In other words, in this case, the area of the opposing surface 65 refers to the area of the opposing surface 65 obtained when the opposing surface 65 is stretched out on a single plane. In these respects, the same applies to the area of the opposing surface 66.

The bent opposing surfaces 65 and 66 as in FIG. 7 are used in a capacitive element 60 according to a third embodiment, which will be described later.

In the present embodiment, the capacitive element 60 has a metal-insulator-metal (MIM) structure. With the MIM structure, the capacitive element 60 having high capacitance density can be realized. Note that "M" of MIM refers to at least one of a metal or a metal compound. "I" of MIM refers to an insulator such as an oxide. That is, MIM is based on the concept including metal oxide metal (MOM). When description is made using the elements of FIG. 6, the capacitive element 60 having a MIM structure is obtained by interposing an insulator, which may be an oxide, between the two electrodes 61 and 62, which are composed of at least one of a metal or a metal compound.

When the imaging element 100 is irradiated with light, positive charge and negative charge, typically, electron-hole pairs are generated in the photoelectric conversion layer 15. For example, suppose that a voltage is applied between the counter electrode 17 and the pixel electrode 13 such that the counter electrode 17 has a higher potential than the pixel electrode 13. In this case, positive charge is collected at the pixel electrode 13, and negative charge is collected at the counter electrode 17. The positive charge collected at the pixel electrode 13 is accumulated in the capacitive element 60.

Returning to FIG. 4, in the circuit configuration 99, a charge accumulation region FD is formed. In the charge accumulation region FD, electric charge generated through photoelectric conversion performed by the photoelectric converter 12 is accumulated. The charge accumulation region may also be referred to as a floating diffusion node.

In the present embodiment, the charge accumulation region FD includes the gate electrode of the amplification transistor 36. The charge accumulation region FD includes the capacitive element 60. The charge accumulation region FD includes one of the source or the drain of the reset transistor 37. The charge accumulation region FD includes the pixel electrode 13.

The charge accumulation region FD may include a wiring line electrically connected to the photoelectric converter 12. The charge accumulation region FD may include at least one of the source or the drain of a transistor other than the reset transistor 37.

In the present embodiment, the proportion of a capacitance $C_{CAP}$ of the capacitive element 60 in a capacitance $C_{FD}$ of the entire charge accumulation region FD, which is a proportion $C_{CAP}/C_{FD}$, is greater than 50%. The proportion $C_{CAP}/C_{FD}$ may be greater than or equal to 70% or may also be greater than or equal to 90%.

An external potential VO is applied to the electrode 62 of the capacitive element 60. Specifically, the external potential VO is a DC potential. The DC potential may be a potential biased from a ground potential or may also be the ground potential.

When the imaging device 100A is in operation, the power supply voltage Vdd is supplied from the power wiring line 48 to one of the source or the drain of the amplification transistor 36. The amplification transistor 36 outputs, as the output signal SIG, a signal voltage corresponding to the amount of signal charge generated by the photoelectric converter 12.

The other one of the source or the drain of the address transistor 35 is connected, with the vertical signal line 45 interposed therebetween, to the load circuit 42 and the column signal processing circuit 40 illustrated in FIG. 3. The load circuit 42 and the amplification transistor 36 form a source follower circuit.

The address signal line 44 is connected to the gate electrode of the address transistor 35. The address signal line 44 is connected to the vertical scanning circuit 52. The vertical scanning circuit 52 applies, to the address signal line 44, a row selection signal for controlling ON and OFF of the address transistor 35. As a result, read-out target lines are scanned in the vertical direction, that is, the column direction, and a certain read-out target row is selected. By controlling ON and OFF of the address transistor 35 via the address signal line 44, the vertical scanning circuit 52 can read out, into the corresponding vertical signal line 45, the output signal SIG from the amplification transistor 36 of the pixel that is selected. The arrangement of the address transistor 35 is not limited to the example illustrated in FIG. 4. The address transistor 35 may be arranged between the drain of the amplification transistor 36 and the power wiring line 48.

The output signal SIG, that is, a signal voltage passes through the address transistor 35 and the vertical signal line 45 in this order and is then input to the column signal processing circuit 40.

The reset signal line 43 is connected to the gate electrode of the reset transistor 37. By applying a row selection signal to an address signal line 44 among the address signal lines 44, the vertical scanning circuit 52 can select, in units of row, pixels to be reset. Moreover, the vertical scanning circuit 52 can turn on the reset transistors 37 of the selected row by applying, to the gate electrodes of the reset transistors 37, a reset signal for controlling ON and OFF of the reset transistors 37 via the reset signal line 43. The potentials of the charge accumulation regions FD are reset by turning on the reset transistors 37.

In this example, the other one of the source or the drain of the reset transistor 37 is connected to the feedback line 46. In this example, as a reset voltage, the voltage of the feedback line 46 is supplied to the charge accumulation region FD. As a result, the potential of the charge accumulation region FD is initialized. In this example, the feedback line 46 is connected to the output terminal of the inverting amplifier 41.

As is understood from FIGS. 2, 3, and 4, an input terminal of the inverting amplifier 41 is connected to the vertical signal line 45. Moreover, the output terminal of the inverting amplifier 41 is connected to the circuit configuration 99 with the feedback line 46 interposed therebetween. When the imaging device 100A is in operation, a predetermined voltage Vref is supplied to the non-inverting input terminal of the inverting amplifier 41. The voltage Vref is, for example, 1 V or a positive voltage near 1 V. A feedback path for negatively feeding back the output signal SIG from the circuit configuration 99 can be formed by turning on the address transistor 35 and the reset transistor 37. Formation of the feedback path causes the voltage of the vertical signal line 45 to be the voltage Vref, which is an input voltage to the non-inverting input terminal of the inverting amplifier 41. In other words, formation of the feedback path causes the voltage of the charge accumulation region FD to be reset to a certain voltage with which the voltage of the vertical signal line 45 becomes Vref. As the voltage Vref, a freely chosen voltage whose magnitude is within the range between the power supply voltage and a ground voltage may be used. In this manner, the imaging device 100A includes the feedback circuits 47, which include the inverting amplifiers 41 partway along the feedback paths. The power supply voltage is, for example, 3.3 V. The ground voltage is 0 V.

As is well known, as a transistor is turned on or off, thermal noise called kTC noise is generated. Noise that is generated by turning on or off a reset transistor is called reset noise. After the charge accumulation region FD is reset, reset noise that is generated by turning off the reset transistor 37 remains in the charge accumulation region FD, which is to accumulate signal charge. However, with the illustrated configuration, the feedback path is formed, so that the alternating-current component of kTC noise is fed back to the source of the reset transistor 37. With the illustrated configuration, the formed feedback path is retained until just before the reset transistor 37 is turned off, and thus reset noise that is generated as the reset transistor 37 is turned off can be reduced.

The photoelectric converter 12 of the first pixel 10a can be referred to as a first photoelectric converter 12a. The pixel electrode 13 of the first photoelectric converter 12a can be referred to as a first pixel electrode 13a. The counter electrode 17 of the first photoelectric converter 12a can be referred to as a first counter electrode 17a. The photoelectric conversion layer 15 of the first photoelectric converter 12a can be referred to as a first photoelectric conversion layer 15a. The first photoelectric converter 12a converts light of the first wavelength region into first electric charge. A first capacitive element 60a accumulates the first electric charge. Specifically, the first photoelectric conversion layer 15a generates the first electric charge. The first pixel electrode 13a collects the first electric charge. The address transistor 35 of the first pixel 10a can be referred to as a first address transistor 35. The amplification transistor 36 of the first pixel 10a can be referred to as a first amplification transistor 36a.

The reset transistor 37 of the first pixel 10a can be referred to as a first reset transistor 37a. The charge accumulation region FD of the first pixel 10a can be referred to as a first charge accumulation region FD. The capacitive element 60 of the first pixel 10a can be referred to as a first capacitive element 60a. The external potential VO that is applied to the first capacitive element 60a can be referred to as a first external potential VO. Description can also be valid that is obtained by changing, in these descriptions, an ordinal numeral of "first" to "second" and changing "a" to "b" at the ends of the reference symbols. Description can also be valid that is obtained by changing, in these descriptions, an ordinal numeral of "first" to "third" and changing "a" to "c" at the ends of the reference symbols. Description can also be valid that is obtained by changing, in these descriptions, an ordinal numeral of "first" to "fourth" and changing "a" to "d" at the ends of the reference symbols. Description can also be valid that is obtained by changing, in these descriptions, an ordinal numeral of "first" to "fifth" and changing "a" to "e" at the ends of the reference symbols.

The electrode 61 of the first capacitive element 60a can be referred to as a first electrode 61. The electrode 62 of the first capacitive element 60a can be referred to as a second electrode 62. The opposing surface 65 of the first electrode 61 can be referred to as a first opposing surface 65. The opposing surface 66 of the second electrode 62 can be referred to as a second opposing surface 66. The dielectric 63 of the first capacitive element 60a can be referred to as a first dielectric 63.

The electrode 61 of a second capacitive element 60b can be referred to as a third electrode 61. The electrode 62 of the second capacitive element 60b can be referred to as a fourth electrode 62. The opposing surface 65 of the third electrode 61 can be referred to as a third opposing surface 65. The opposing surface 66 of the fourth electrode 62 can be referred to as a fourth opposing surface 66. The dielectric 63 of the second capacitive element 60b can be referred to as a second dielectric 63.

The electrode 61 of a third capacitive element 60c can be referred to as a fifth electrode 61. The electrode 62 of the third capacitive element 60c can be referred to as a sixth electrode 62. The opposing surface 65 of the fifth electrode 61 can be referred to as a fifth opposing surface 65. The opposing surface 66 of the sixth electrode 62 can be referred to as a sixth opposing surface 66. The dielectric 63 of the third capacitive element 60c can be referred to as a third dielectric 63.

The electrode 61 of a fourth capacitive element 60d can be referred to as a seventh electrode 61. The electrode 62 of the fourth capacitive element 60d can be referred to as an eighth electrode 62. The opposing surface 65 of the seventh electrode 61 can be referred to as a seventh opposing surface 65. The opposing surface 66 of the eighth electrode 62 can be referred to as an eighth opposing surface 66. The dielectric 63 of the fourth capacitive element 60d can be referred to as a fourth dielectric 63.

The electrode 61 of a fifth capacitive element 60e can be referred to as a ninth electrode 61. The electrode 62 of the fifth capacitive element 60e can be referred to as a tenth electrode 62. The opposing surface 65 of the ninth electrode 61 can be referred to as a ninth opposing surface 65. The opposing surface 66 of the tenth electrode 62 can be referred to as a tenth opposing surface 66. The dielectric 63 of the fifth capacitive element 60e can be referred to as a fifth dielectric 63.

In the present embodiment, in a plan view, the area of the first pixel electrode 13a is larger than that of a second pixel electrode 13b. In a plan view, the area of the first pixel electrode 13a is larger than that of a third pixel electrode 13c. In a plan view, the area of the first pixel electrode 13a is larger than that of a fourth pixel electrode 13d. In a plan view, the area of the first pixel electrode 13a is larger than that of a fifth pixel electrode 13e. According to these characteristics, even when light of the first wavelength region is weak, the first electric charge can be easily collected using the first pixel electrode 13a. In other words, even when light of the first wavelength region is weak, sensitivity can be easily achieved with which the light can be detected.

In the present embodiment, the first counter electrode 17a is electrically separated from a second counter electrode 17b, a third counter electrode 17c, a fourth counter electrode 17d, and a fifth counter electrode 17e. Thus, switching as to whether light of the first wavelength region is to be reflected in an image and switching as to whether light of the second to fifth wavelength regions is to be reflected in an image can be performed independently of each other. In the present embodiment, the second counter electrode 17b, the third counter electrode 17c, the fourth counter electrode 17d, and the fifth counter electrode 17e are electrically connected to each other.

FIG. 8 illustrates, in a plan view, the first pixel electrodes 13a, the second pixel electrodes 13b, the third pixel electrodes 13c, the fourth pixel electrodes 13d, and the fifth pixel electrodes 13e. In FIG. 8, signs "IR", "G", "R", and "B" denote wavelength regions (colors) of light that the photoelectric conversion layers 15 associated with the individual pixel electrodes 13 photoelectrically convert. Specifically, "IR" denotes infrared light. "G" denotes green light. "R" denotes red light. "B" denotes blue light. Considering the visibility of the drawing, in FIG. 8, the first pixel electrodes 13a, the second pixel electrodes 13b, the third pixel electrodes 13c, the fourth pixel electrodes 13d, and the fifth pixel electrodes 13e are illustrated in a non-overlapping manner. In a plan view, in each unit pixel 10, the first pixel electrode 13a may overlap the second pixel electrode 13b, the third pixel electrode 13c, the fourth pixel electrode 13d, and the fifth pixel electrode 13e.

As described above, in the present embodiment, the first wavelength region includes the wavelength region of infrared light. The first photoelectric conversion layer 15a converts light of the first wavelength region into first electric charge. The first electric charge generated in this manner is collected by the first pixel electrode 13a.

The second wavelength region includes the wavelength region of green light. A second photoelectric conversion layer 15b converts light of the second wavelength region into second electric charge. The second electric charge generated in this manner is collected by the second pixel electrode 13b.

The third wavelength region includes the wavelength region of green light. A third photoelectric conversion layer 15c converts light of the third wavelength region into third electric charge. The third electric charge generated in this manner is collected by the third pixel electrode 13c.

The fourth wavelength region includes the wavelength region of red light. A fourth photoelectric conversion layer 15d converts light of the fourth wavelength region into fourth electric charge. The fourth electric charge generated in this manner is collected by the fourth pixel electrode 13d.

The fifth wavelength region includes the wavelength region of blue light. A fifth photoelectric conversion layer 15e converts light of the fifth wavelength region into fifth electric charge. The fifth electric charge generated in this manner is collected by the fifth pixel electrode 13e.

FIG. 9 illustrates, in a plan view, the first capacitive element 60a, the second capacitive element 60b, the third capacitive element 60c, the fourth capacitive element 60d, and the fifth capacitive element 60e. Specifically, FIG. 9 illustrates, in a plan view, the electrodes 61 of the first capacitive element 60a, the second capacitive element 60b, the third capacitive element 60c, the fourth capacitive element 60d, and the fifth capacitive element 60e.

FIG. 11 is a cross-sectional view of the imaging element 100, the view illustrating a first cross section parallel to the thickness direction of the semiconductor substrate 1 and taken along a first dotted line DL1 of FIG. 8 and line XI-XI of FIG. 9, the line XI-XI corresponding to the first dotted line DL1. FIG. 12 is a cross-sectional view of the imaging element 100, the view illustrating a second cross section parallel to the thickness direction of the semiconductor substrate 1 and taken along a second dotted line DL2 of FIG. 8 and line XII-XII of FIG. 9, the line XII-XII corresponding to the second dotted line DL2.

As is understood from FIGS. 11 and 12, in the present embodiment, the first capacitive element 60a, the second capacitive element 60b, the third capacitive element 60c, the fourth capacitive element 60d, and the fifth capacitive element 60e are arranged in the same layer. This may make manufacturing of the imaging element 100 easy.

"A plurality of elements are arranged in the same layer" refers to existence of a cross section that is perpendicular to the thickness direction of the semiconductor substrate 1 and passes through the plurality of elements. In contrast, "a plurality of elements are arranged in different layers" refers to non-existence of a cross section that is perpendicular to the thickness direction of the semiconductor substrate 1 and passes through the plurality of elements.

In the example illustrated in FIG. 9, in a plan view, the first capacitive element 60a is rectangular. In a plan view, the first electrode 61 of the first capacitive element 60a is rectangular. In a plan view, the second electrode 62 of the first capacitive element 60a is rectangular. In a plan view, the first dielectric 63 of the first capacitive element 60a is rectangular. Rectangular is a concept that includes square.

Note that, in a plan view, the outline of the first capacitive element 60a may have a rounded shape. FIG. 10 illustrates the first capacitive element 60a that has a rounded shape in a plan view. In the example illustrated in FIG. 10, in a plan view, a reference rectangle RT, which is a rectangle having the smallest area among a plurality of rectangles that contain the first capacitive element 60a, is different from the outline of the first capacitive element 60a. In reality, in a case where, for example, the size of the first capacitive element 60a is small, the first capacitive element 60a tends to have a more rounded shape in a plan view. Note that, as in the example illustrated in FIG. 9, in a plan view, the reference rectangle RT may match the outline of the first capacitive element 60a. In these respects, the same applies to the first electrode 61, the second electrode 62, and the first dielectric 63 of the first capacitive element 60a.

In this case, a straight line including one of two diagonals of the reference rectangle RT is defined as a first straight line SL1. A straight line including the other one of the two diagonals is defined as a second straight line SL2. In this case, in a plan view, the first straight line SL1 passes through the second capacitive element 60b, the first capacitive element 60a, and the third capacitive element 60c in this order. In a plan view, the second straight line SL2 passes through the fourth capacitive element 60d, the first capacitive element 60a, and the fifth capacitive element 60e in this order. This configuration is advantageous from the viewpoint of symmetrically arranging the second capacitive element 60b, the third capacitive element 60c, the fourth capacitive element 60d, and the fifth capacitive element 60e and ensuring the area of each of the first capacitive element 60a, the second capacitive element 60b, the third capacitive element 60c, the fourth capacitive element 60d, and the fifth capacitive element 60e in a plan view in the unit pixel 10. In a case where a plurality of unit pixels 10 are arranged in a matrix shape, symmetry described above being ensured in each unit pixel 10 is advantageous from the viewpoint of suppressing variations in the sensitivities of the unit pixels 10. Note that the first straight line SL1 may correspond to the first dotted line DL1. The second straight line SL2 may correspond to the second dotted line DL2.

Specifically, in a plan view, the second capacitive element 60b, the third capacitive element 60c, the fourth capacitive element 60d, and the fifth capacitive element 60e each have a bent shape. In a plan view, the first capacitive element 60a protrudes toward the second capacitive element 60b, the third capacitive element 60c, the fourth capacitive element 60d, and the fifth capacitive element 60e. In a plan view, the second capacitive element 60b, a first gap GP1, the fourth capacitive element 60d, a second gap GP2, the third capacitive element 60c, a third gap GP3, the fifth capacitive element 60e, and a fourth gap GP4 are placed side by side in this order at positions that surround the first capacitive element 60a.

The definition of the reference rectangle RT may be changed and read as a rectangle having the smallest area among a plurality of rectangles that contain the first electrode 61 of the first capacitive element 60a. When the definition of the reference rectangle RT is changed and read as above, in the present embodiment, the first straight line SL1 passes through the third electrode 61 of the second capacitive element 60b, the first electrode 61 of the first capacitive element 60a, and the fifth electrode 61 of the third capacitive element 60c in this order. In a plan view, the second straight line SL2 passes through the seventh electrode 61 of the fourth capacitive element 60d, the first electrode 61 of the first capacitive element 60a, and the ninth electrode 61 of the fifth capacitive element 60e in this order.

Specifically, in a plan view, the third electrode 61, the fifth electrode 61, the seventh electrode 61, and the ninth electrode 61 each have a bent shape. In a plan view, the first electrode 61 protrudes toward the third electrode 61, the fifth electrode 61, the seventh electrode 61, and the ninth electrode 61. In a plan view, the third electrode 61, the first gap GP1, the seventh electrode 61, the second gap GP2, the fifth electrode 61, the third gap GP3, the ninth electrode 61, and the fourth gap GP4 are placed side by side in this order at the positions that surround the first electrode 61.

The definition of the reference rectangle RT may be changed and read as a rectangle having the smallest area among a plurality of rectangles that contain the second electrode 62 of the first capacitive element 60a. When the definition of the reference rectangle RT is changed and read as above, in the present embodiment, the first straight line SL1 passes through the fourth electrode 62 of the second capacitive element 60b, the second electrode 62 of the first capacitive element 60a, and the sixth electrode 62 of the third capacitive element 60c in this order. In a plan view, the second straight line SL2 passes through the eighth electrode 62 of the fourth capacitive element 60d, the second electrode 62 of the first capacitive element 60a, and the tenth electrode 62 of the fifth capacitive element 60e in this order.

Specifically, in a plan view, the fourth electrode 62, the sixth electrode 62, the eighth electrode 62, and the tenth electrode 62 each have a bent shape. In a plan view, the second electrode 62 protrudes toward the fourth electrode 62, the sixth electrode 62, the eighth electrode 62, and the tenth electrode 62. In a plan view, the fourth electrode 62, the first gap GP1, the eighth electrode 62, the second gap GP2, the sixth electrode 62, the third gap GP3, the tenth electrode 62, and the fourth gap GP4 are placed side by side in this order at the positions that surround the second electrode 62.

The definition of the reference rectangle RT may be changed and read as a rectangle having the smallest area among a plurality of rectangles that contain the first dielectric 63 of the first capacitive element 60*a*. When the definition of the reference rectangle RT is changed and read as above, in the present embodiment, the first straight line SL1 passes through the second dielectric 63 of the second capacitive element 60*b*, the first dielectric 63 of the first capacitive element 60*a*, and the third dielectric 63 of the third capacitive element 60*c* in this order. In a plan view, the second straight line SL2 passes through the fourth dielectric 63 of the fourth capacitive element 60*d*, the first dielectric 63 of the first capacitive element 60*a*, and the fifth dielectric 63 of the fifth capacitive element 60*e* in this order.

Specifically, in a plan view, the second dielectric 63, the third dielectric 63, the fourth dielectric 63, and the fifth dielectric 63 each have a bent shape. In a plan view, the first dielectric 63 protrudes toward the second dielectric 63, the third dielectric 63, the fourth dielectric 63, and the fifth dielectric 63. In a plan view, the second dielectric 63, the first gap GP1, the fourth dielectric 63, the second gap GP2, the third dielectric 63, the third gap GP3, the fifth dielectric 63, and the fourth gap GP4 are placed side by side in this order at the positions that surround the first dielectric 63.

In the present embodiment, the area of the first opposing surface 65 is larger than that of the third opposing surface 65. The area of the first opposing surface 65 is larger than that of the fifth opposing surface 65. The area of the first opposing surface 65 is larger than that of the seventh opposing surface 65. The area of the first opposing surface 65 is larger than that of the ninth opposing surface 65. The area of the second opposing surface 66 is larger than that of the fourth opposing surface 66. The area of the second opposing surface 66 is larger than that of the sixth opposing surface 66. The area of the second opposing surface 66 is larger than that of the eighth opposing surface 66. The area of the second opposing surface 66 is larger than that of the tenth opposing surface 66. By setting the areas in this manner, the capacitance of the first capacitive element 60*a* is easily increased. Thus, a large amount of electric charge is easily accumulated in the first capacitive element 60*a*. That is, the first capacitive element 60*a* having a high saturated charge amount is realized. As a result, a wide dynamic range regarding the first wavelength region may be achieved.

The proportion of an area S1 of the first opposing surface 65 to an area S3 of the third opposing surface 65, which is a proportion S1/S3, is for example greater than or equal to 1.1 and less than or equal to 5. The proportion S1/S3 may be greater than or equal to 1.2 and less than or equal to 4. The same applies to the proportion of the area S1 of the first opposing surface 65 to an area S5 of the fifth opposing surface 65, which is a proportion S1/S5. The same applies to the proportion of the area S1 of the first opposing surface 65 to an area S7 of the seventh opposing surface 65, which is a proportion S1/S7. The same applies to the proportion of the area S1 of the first opposing surface 65 to an area S9 of the ninth opposing surface 65, which is a proportion S1/S9. The same applies to the proportion of an area S2 of the second opposing surface 66 to an area S4 of the fourth opposing surface 66, which is a proportion S2/S4. The same applies to the proportion of the area S2 of the second opposing surface 66 to an area S6 of the sixth opposing surface 66, which is a proportion S2/S6. The same applies to the proportion of the area S2 of the second opposing surface 66 to an area S8 of the eighth opposing surface 66, which is a proportion S2/S8. The same applies to the proportion of the area S2 of the second opposing surface 66 to an area S10 of the tenth opposing surface 66, which is a proportion S2/S10.

In the present embodiment, the permittivity of the first dielectric 63 is equal to that of the second dielectric 63. The permittivity of the first dielectric 63 is equal to that of the third dielectric 63. The permittivity of the first dielectric 63 is equal to that of the fourth dielectric 63. The permittivity of the first dielectric 63 is equal to that of the fifth dielectric 63. These may make manufacturing of the imaging element 100 easy.

Note that the permittivity of the first dielectric 63 may be higher or lower than that of the second dielectric 63. The permittivity of the first dielectric 63 may be higher or lower than that of the third dielectric 63. The permittivity of the first dielectric 63 may be higher or lower than that of the fourth dielectric 63. The permittivity of the first dielectric 63 may be higher or lower than that of the fifth dielectric 63.

In the present embodiment, the thickness of the first dielectric 63 is equal to that of the second dielectric 63. The thickness of the first dielectric 63 is equal to that of the third dielectric 63. The thickness of the first dielectric 63 is equal to that of the fourth dielectric 63. The thickness of the first dielectric 63 is equal to that of the fifth dielectric 63. These may make manufacturing of the imaging element 100 easy.

Note that the first dielectric 63 may be thicker or thinner than the second dielectric 63. The first dielectric 63 may be thicker or thinner than the third dielectric 63. The first dielectric 63 may be thicker or thinner than the fourth dielectric 63. The first dielectric 63 may be thicker or thinner than the fifth dielectric 63.

In the present embodiment, the capacitance of the first capacitive element 60*a* is higher than that of the second capacitive element 60*b*. The capacitance of the first capacitive element 60*a* is higher than that of the third capacitive element 60*c*. The capacitance of the first capacitive element 60*a* is higher than that of the fourth capacitive element 60*d*. The capacitance of the first capacitive element 60*a* is higher than that of the fifth capacitive element 60*e*. These characteristics are appropriate to achieve a wide dynamic range regarding the first wavelength region.

Note that the capacitance of the first capacitive element 60*a* may be equal to or lower than that of the second capacitive element 60*b*. The capacitance of the first capacitive element 60*a* may be equal to or lower than that of the third capacitive element 60*c*. The capacitance of the first capacitive element 60*a* may be equal to or lower than that of the fourth capacitive element 60*d*. The capacitance of the first capacitive element 60*a* may be equal to or lower than that of the fifth capacitive element 60*e*.

The proportion of a capacitance C1 of the first capacitive element 60*a* to a capacitance C2 of the second capacitive element 60*b*, which is a proportion C1/C2, is for example greater than or equal to 0.25 and less than or equal to 4. The same applies to the proportion of the capacitance C1 of the first capacitive element 60*a* to a capacitance C3 of the third capacitive element 60*c*, which is a proportion C1/C3. The same applies to the proportion of the capacitance C1 of the first capacitive element 60a to a capacitance C4 of the fourth capacitive element 60d, which is a proportion C1/C4. The same applies to the proportion of the capacitance C1 of the first capacitive element 60a to a capacitance C5 of the fifth capacitive element 60e, which is a proportion C1/C5.

As is understood from the description above, the first reset transistor 37a resets the electric potential of the first capacitive element 60a. A second reset transistor 37b resets the electric potential of the second capacitive element 60b. A third reset transistor 37c resets the electric potential of the third capacitive element 60c. A fourth reset transistor 37d resets the electric potential of the fourth capacitive element 60d. A fifth reset transistor 37e resets the electric potential of the fifth capacitive element 60e.

In the present embodiment, the gate width of the first reset transistor 37a is larger than that of the second reset transistor 37b. As described above, in the present embodiment, the capacitance of the first capacitive element 60a is higher than that of the second capacitive element 60b. In this case, current that flows between the source and the drain of the first reset transistor 37a when the electric potential of the first capacitive element 60a is reset tends to be larger than current that flows between the source and the drain of the second reset transistor 37b when the electric potential of the second capacitive element 60b is reset. In this respect, by setting the gate width magnitude relationship as above, it is easy to make withstand current of the first reset transistor 37a larger than that of the second reset transistor 37b. Thus, according to the present embodiment, it is easy to keep withstand currents of the first reset transistor 37a and the second reset transistor 37b moderate.

Moreover, in the present embodiment, the gate width of the first reset transistor 37a is larger than that of the third reset transistor 37c. The gate width of the first reset transistor 37a is larger than that of the fourth reset transistor 37d. The gate width of the first reset transistor 37a is larger than that of the fifth reset transistor 37e.

In this case, a gate width refers to, in a plan view, the size of a gate electrode regarding the direction perpendicular to the direction of a gate length. The gate length refers to the size of the gate electrode regarding the direction from the source to the drain or from the drain to the source.

In the following, the present embodiment will be further described with reference to FIGS. 11 and 12.

A second photoelectric converter 12b, a third photoelectric converter 12c, a fourth photoelectric converter 12d, and a fifth photoelectric converter 12e are arranged in the same layer. In the following, the layer in which the second photoelectric converter 12b, the third photoelectric converter 12c, the fourth photoelectric converter 12d, and the fifth photoelectric converter 12e are arranged may be referred to as a second layer 102.

The first photoelectric converter 12a is arranged in a different layer from the second photoelectric converter 12b, the third photoelectric converter 12c, the fourth photoelectric converter 12d, and the fifth photoelectric converter 12e. In the following, the layer in which the first photoelectric converter 12a is arranged may be referred to as a first layer 101.

Specifically, the semiconductor substrate 1, a wiring layer including wiring lines 5a, 5b, 5c, 5d, and 5e, the insulating layer 7, a wiring layer including wiring lines 4a, 4b, 4c, 4d, and 4e, the insulating layer 8, the first layer 101, the insulating layer 9, and the second layer 102 are arranged from below to above in this order.

As described above, the first photoelectric converter 12a has the first counter electrode 17a, the first pixel electrode 13a, and the first photoelectric conversion layer 15a. The second photoelectric converter 12b has the second counter electrode 17b, the second pixel electrode 13b, and the second photoelectric conversion layer 15b. The third photoelectric converter 12c has the third counter electrode 17c, the third pixel electrode 13c, and the third photoelectric conversion layer 15c. The fourth photoelectric converter 12d has the fourth counter electrode 17d, the fourth pixel electrode 13d, and the fourth photoelectric conversion layer 15d. The fifth photoelectric converter 12e has the fifth counter electrode 17e, the fifth pixel electrode 13e, and the fifth photoelectric conversion layer 15e.

The second counter electrode 17b, the third counter electrode 17c, the fourth counter electrode 17d, and the fifth counter electrode 17e constitute a single integrated electrode. The second photoelectric conversion layer 15b, the third photoelectric conversion layer 15c, the fourth photoelectric conversion layer 15d, and the fifth photoelectric conversion layer 15e constitute a single integrated film. In contrast, the first pixel electrode 13a, the second pixel electrode 13b, the third pixel electrode 13c, the fourth pixel electrode 13d, and the fifth pixel electrode 13e are separated from each other.

Note that the second counter electrode 17b, the third counter electrode 17c, the fourth counter electrode 17d, and the fifth counter electrode 17e may be separated from each other. The second photoelectric conversion layer 15b, the third photoelectric conversion layer 15c, the fourth photoelectric conversion layer 15d, and the fifth photoelectric conversion layer 15e may be separated from each other.

In the present embodiment, the semiconductor substrate 1, the first layer 101, the second layer 102, and a light receiving surface are arranged from below to above in this order. In the present embodiment, the light receiving surface includes condenser lenses 21b, 21c, 21d, and 21e, which will be described later. In this case, the light receiving surface is the light receiving surface of the imaging device or the light receiving surface of the imaging element 100.

Out of the first photoelectric converter 12a and the second photoelectric converter 12b, the photoelectric converter closer to the light receiving surface is defined as a proximal photoelectric converter, and the photoelectric converter farther from the light receiving surface is defined as a distal photoelectric converter. In this case, the central wavelength of the wavelength region of light that the proximal photoelectric converter photoelectrically converts is shorter than the central wavelength of the wavelength region of light that the distal photoelectric converter photoelectrically converts. Short wavelength light is more likely to be attenuated than long wavelength light. However, with such a configuration, attenuation of short wavelength light can be reduced.

In the present embodiment, the proximal photoelectric converter is the one farther from the semiconductor substrate 1 out of the first photoelectric converter 12a and the second photoelectric converter 12b. The distal photoelectric converter is the one closer to the semiconductor substrate 1 out of the first photoelectric converter 12a and the second photoelectric converter 12b.

As is understood from the description above, in the present embodiment, the second photoelectric converter 12b, the third photoelectric converter 12c, the fourth photoelectric converter 12d, and the fifth photoelectric converter 12e are arranged closer to the light receiving surface than the first photoelectric converter 12a is. Note that the first photoelectric converter 12a may be arranged closer to the light receiving surface than the second photoelectric converter 12b, the third photoelectric converter 12c, the fourth photoelectric converter 12d, and the fifth photoelectric converter 12e are.

In the present embodiment, the second pixel electrode 13b, the third pixel electrode 13c, the fourth pixel electrode 13d, and the fifth pixel electrode 13e are transparent electrodes that have translucency and conductivity. The transparent electrodes are composed of an oxide and are specifically composed of ITO. The first pixel electrode 13a is a non-transparent electrode that does not have translucency but has conductivity. As materials of the non-transparent electrode, metals, metal oxides, metal nitrides, and conductive polysilicon are taken as examples. When the second pixel electrode 13b, the third pixel electrode 13c, the fourth pixel electrode 13d, and the fifth pixel electrode 13e are composed of a material having translucency, it is more likely that light of the first wavelength region passes through the second pixel electrode 13b, the third pixel electrode 13c, the fourth pixel electrode 13d, and the fifth pixel electrode 13e and is absorbed by the first photoelectric conversion layer 15a. As a result, the sensitivity of the first photoelectric converter 12a can be sufficiently ensured.

The insulating layers 7, 8, and 9 are composed of insulating materials such as $SiO_2$. The wiring lines 4a, 4b, 4c, 4d, 4e, 5a, 5b, 5c, 5d, and 5e are composed of metal. Examples of the metal include aluminum (Al) and copper (Cu).

The first counter electrode 17a, the second counter electrode 17b, the third counter electrode 17c, the fourth counter electrode 17d, and the fifth counter electrode 17e are each a transparent electrode having translucency and conductivity. The transparent electrodes are composed of an oxide and are specifically composed of ITO.

The positional relationship of the second pixel electrode 13b, the third pixel electrode 13c, the fourth pixel electrode 13d, and the fifth pixel electrode 13e with respect to the second counter electrode 17b, the third counter electrode 17c, the fourth counter electrode 17d, and the fifth counter electrode 17e may be switched. In this case, the second counter electrode 17b, the third counter electrode 17c, the fourth counter electrode 17d, and the fifth counter electrode 17e and the first counter electrode 17a can be formed so as to be integrated with each other by omitting the insulating layer 9. In other words, a single counter electrode may be provided between the first photoelectric conversion layer 15a and the second to fifth photoelectric conversion layers 15b to 15e, the single counter electrode being electrically in contact with the first photoelectric conversion layer 15a and with the second to fifth photoelectric conversion layers 15b to 15e.

Each unit pixel 10 has a first plug 31a, a second plug 31b, a third plug 31c, a fourth plug 31d, and a fifth plug 31e. The first plug 31a, the second plug 31b, the third plug 31c, the fourth plug 31d, and the fifth plug 31e are conductors. That is, the first plug 31a, the second plug 31b, the third plug 31c, the fourth plug 31d, and the fifth plug 31e are composed of conductive materials. Examples of the conductive materials include metals, metal oxides, metal nitrides, and conductive polysilicon.

In the present embodiment, the first plug 31a, the second plug 31b, the third plug 31c, the fourth plug 31d, and the fifth plug 31e extend in the thickness direction of the semiconductor substrate 1.

The first pixel electrode 13a, the first capacitive element 60a, the gate electrode of the first amplification transistor 36a, and one of the source or the drain of the first reset transistor 37a are electrically connected to each other by using the first plug 31a and the wiring line 4a. The second pixel electrode 13b, the second capacitive element 60b, the gate electrode of a second amplification transistor 36b, and one of the source or the drain of the second reset transistor 37b are electrically connected to each other by using the second plug 31b and the wiring line 4b. The third pixel electrode 13c, the third capacitive element 60c, the gate electrode of a third amplification transistor 36c, and one of the source or the drain of the third reset transistor 37c are electrically connected to each other by using the third plug 31c and the wiring line 4c. The fourth pixel electrode 13d, the fourth capacitive element 60d, the gate electrode of a fourth amplification transistor 36d, and one of the source or the drain of the fourth reset transistor 37d are electrically connected to each other by using the fourth plug 31d and the wiring line 4d. The fifth pixel electrode 13e, the fifth capacitive element 60e, the gate electrode of a fifth amplification transistor 36e, and one of the source or the drain of the fifth reset transistor 37e are electrically connected to each other by using the fifth plug 31e and the wiring line 4e.

Through the wiring line 5a, the first external potential VO is supplied to the second electrode 62 of the first capacitive element 60a. Through the wiring line 5b, a second external potential VO is supplied to the fourth electrode 62 of the second capacitive element 60b. Through the wiring line 5c, a third external potential VO is supplied to the sixth electrode 62 of the third capacitive element 60c. Through the wiring line 5d, a fourth external potential VO is supplied to the eighth electrode 62 of the fourth capacitive element 60d. Through the wiring line 5e, a fifth external potential VO is supplied to the tenth electrode 62 of the fifth capacitive element 60e. The first external potential VO, the second external potential VO, the third external potential VO, the fourth external potential VO, and the fifth external potential VO may be equal to each other or may be different from each other.

The insulating layer 1g is provided on the surface of the semiconductor substrate 1. In a typical example, the insulating layer 1g is an oxide of a semiconductor material of the semiconductor substrate 1. The insulating layer 1g forms the gate insulating films of the first amplification transistor 36a, the second amplification transistor 36b, the third amplification transistor 36c, the fourth amplification transistor 36d, the fifth amplification transistor 36e, the first reset transistor 37a, the second reset transistor 37b, the third reset transistor 37c, the fourth reset transistor 37d, and the fifth reset transistor 37e. Note that, in FIGS. 11 and 12, illustration of the first address transistor 35 and second to fifth address transistors 35 is omitted. The insulating layer 1g also forms the gate insulating films of these address transistors 35.

In FIGS. 11 and 12, a vertical dotted line is drawn between the insulating layer 1g and the wiring layer in which the wiring lines 5a, 5b, 5c, 5d, and 5e are provided. Elements that are not described in the present embodiment may be provided in the layer(s) schematically illustrated using the vertical dotted line.

Moreover, in FIGS. 11 and 12, thick lines are connected to the gate electrodes of the first amplification transistor 36a, the second amplification transistor 36b, the third amplification transistor 36c, the fourth amplification transistor 36d, and the fifth amplification transistor 36e. The thick lines are also connected to one of the source or the drain of each of the first reset transistor 37a, the second reset transistor 37b, the third reset transistor 37c, the fourth reset transistor 37d, and the fifth reset transistor 37e. The thick lines are also connected to the first plug 31a, the second plug 31b, the third plug 31c, the fourth plug 31d, and the fifth plug 31e. In FIGS. 11 and 12, the thick lines schematically represent electrical connection.

The imaging element 100 according to the present embodiment has a multilayer structure. "Multilayer" refers to existence of a plurality of photoelectric converters in the thickness direction of the semiconductor substrate 1. With a multilayer structure, the areas of pixel electrodes can be sufficiently ensured, and thus use of a multilayer structure is advantageous to improve the sensitivities of pixels. In the present embodiment, it can be said that the imaging element 100 has a two-layer structure since the second photoelectric converter 12b, the third photoelectric converter 12c, the fourth photoelectric converter 12d, and the fifth photoelectric converter 12e provided in the second layer 102 and the first photoelectric converter 12a provided in the first layer 101, which is positioned below the second layer 102, are present.

In general, the band gap of a material that is sensitive to infrared light is narrower than the band gap of a material (panchromatic material) that is sensitive to visible light. Thus, when a photoelectric conversion layer is formed using a material that is sensitive to infrared light, the amount of dark current due to thermal excitation at normal temperatures theoretically increases. In the present embodiment, the first photoelectric conversion layer 15a is electrically insulated from the second photoelectric conversion layer 15b, the third photoelectric conversion layer 15c, the fourth photoelectric conversion layer 15d, and the fifth photoelectric conversion layer 15e. Thus, a dark current generated in the first photoelectric conversion layer 15a can be prevented from flowing into the second photoelectric conversion layer 15b, the third photoelectric conversion layer 15c, the fourth photoelectric conversion layer 15d, and the fifth photoelectric conversion layer 15e. As a result, degradation of image quality due to a dark current can be prevented.

The imaging element 100 has a second color filter 19b, a third color filter 19c, a fourth color filter 19d, and a fifth color filter 19e. The second color filter 19b, the third color filter 19c, the fourth color filter 19d, and the fifth color filter 19e are arranged above the second layer 102.

The wavelength region of light that the second color filter 19b allows to pass therethrough is the second wavelength region. The wavelength region of light that the third color filter 19c allows to pass therethrough is the third wavelength region. The wavelength region of light that the fourth color filter 19d allows to pass therethrough is the fourth wavelength region. The wavelength region of light that the fifth color filter 19e allows to pass therethrough is the fifth wavelength region.

In the present embodiment, the second color filter 19b, the third color filter 19c, the fourth color filter 19d, and the fifth color filter 19e constitute a Bayer filter. By using the second color filter 19b, the third color filter 19c, the fourth color filter 19d, and the fifth color filter 19e, blue, green, and red color information is acquired from the second photoelectric conversion layer 15b, the third photoelectric conversion layer 15c, the fourth photoelectric conversion layer 15d, and the fifth photoelectric conversion layer 15e, so that a full-color image can be formed.

The imaging element 100 has a second condenser lens 21b, a third condenser lens 21c, a fourth condenser lens 21d, and a fifth condenser lens 21e. The second condenser lens 21b, the third condenser lens 21c, the fourth condenser lens 21d, and the fifth condenser lens 21e are arranged above the second color filter 19b, the third color filter 19c, the fourth color filter 19d, and the fifth color filter 19e, respectively.

The second condenser lens 21b, the third condenser lens 21c, the fourth condenser lens 21d, and the fifth condenser lens 21e constitute the light receiving surface of the imaging element 100. The amount of obliquely incident light can be reduced by using the second condenser lens 21b, the third condenser lens 21c, the fourth condenser lens 21d, and the fifth condenser lens 21e. As a result, color blending due to obliquely incident light can be suppressed.

The second photoelectric conversion layer 15b is irradiated with light that has passed through the second condenser lens 21b and the second color filter 19b in this order. The third photoelectric conversion layer 15c is irradiated with light that has passed through the third condenser lens 21c and the third color filter 19c in this order. The fourth photoelectric conversion layer 15d is irradiated with light that has passed through the fourth condenser lens 21d and the fourth color filter 19d in this order. The fifth photoelectric conversion layer 15e is irradiated with light that has passed through the fifth condenser lens 21e and the fifth color filter 19e in this order.

In the present embodiment, the second condenser lens 21b, the third condenser lens 21c, the fourth condenser lens 21d, and the fifth condenser lens 21e constitute a group of lenses that is formed in an integrated manner. This group of lenses that is formed in an integrated manner has a surface with a plurality of convex portions. Regarding the surface, the convex portions belong to the second condenser lens 21b, the third condenser lens 21c, the fourth condenser lens 21d, and the fifth condenser lens 21e on a one-to-one basis.

The imaging element 100 has a first shield electrode 23 and a second shield electrode 24. The first shield electrode 23 is arranged in the same layer as the second pixel electrode 13b, the third pixel electrode 13c, the fourth pixel electrode 13d, and the fifth pixel electrode 13e. The second shield electrode 24 is arranged in the same layer as the first pixel electrode 13a.

In a plan view, the first shield electrode 23 includes a portion that extends between the second pixel electrode 13b and the fourth pixel electrode 13d. In a plan view, the first shield electrode 23 includes a portion that extends between the second pixel electrode 13b and the fifth pixel electrode 13e. In a plan view, the first shield electrode 23 includes a portion that extends between the third pixel electrode 13c and the fourth pixel electrode 13d. In a plan view, the first shield electrode 23 includes a portion that extends between the third pixel electrode 13c and the fifth pixel electrode 13e.

In a plan view, one of two adjacent unit pixels 10 is defined as a first unit pixel 10, and the other one is defined as a second unit pixel 10. In this case, in a plan view, the second shield electrode 24 includes a portion that extends between the first pixel electrode 13a of the first unit pixel 10 and the first pixel electrode 13a of the second unit pixel 10.

Charge collection efficiency at each of the second pixel electrode 13b, the third pixel electrode 13c, the fourth pixel electrode 13d, and the fifth pixel electrode 13e is improved by provision of the first shield electrode 23. Specifically, as described above, the second photoelectric conversion layer 15b, the third photoelectric conversion layer 15c, the fourth photoelectric conversion layer 15d, and the fifth photoelectric conversion layer 15e constitute a single integrated film. By applying an appropriate bias voltage to the first shield electrode 23, an appropriate potential gradient is generated at a portion of the single integrated film, the portion overlapping the first shield electrode 23 in a plan view. By this potential gradient, the charge collection efficiency at each of the second pixel electrode 13b, the third pixel electrode 13c, the fourth pixel electrode 13d, and the fifth pixel electrode 13e is improved. Moreover, by this potential gradient, a phenomenon is suppressed in which charge that is supposed to flow into a certain pixel electrode flows into another pixel electrode. As a result, electrical color blending is prevented. Thus, high resolution and high sensitivity may be achieved at the same time.

Similarly, the charge collection efficiency at the first pixel electrode 13a is improved by provision of the second shield electrode 24. Specifically, by applying an appropriate bias voltage to the second shield electrode 24, an appropriate potential gradient is generated at a portion of the first photoelectric conversion layer 15a, the portion overlapping the second shield electrode 24 in a plan view. By this potential gradient, the charge collection efficiency at the first pixel electrode 13a is improved. Moreover, by this potential gradient, the phenomenon is suppressed in which charge that is supposed to flow into a certain pixel electrode flows into another pixel electrode. As a result, electrical color blending is prevented. Thus, high resolution and high sensitivity may be achieved at the same time.

The first shield electrode 23 is a transparent electrode that has translucency and conductivity. The transparent electrode is composed of an oxide and is specifically composed of ITO. The second shield electrode 24 is a non-transparent electrode that does not have translucency but has conductivity. As materials of the non-transparent electrode, metals, metal oxides, metal nitrides, and conductive polysilicon are taken as examples. The first shield electrode 23 may be composed of the same material as or a different material from the second pixel electrode 13b, the third pixel electrode 13c, the fourth pixel electrode 13d, and the fifth pixel electrode 13e. The second shield electrode 24 may be composed of the same material as or a different material from the first pixel electrode 13a.

In the present embodiment, the first shield electrode 23 is a single electrode having a single electric potential. Note that the first shield electrode 23 may have a plurality of portions that are insulated from each other. The plurality of portions of the first shield electrode 23 may have the same electric potential or may have different electric potentials from each other. These also apply to the second shield electrode 24.

The imaging element 100 further has at least one plug 27, which electrically connects the first shield electrode 23 to the second shield electrode 24. Each plug 27 is a conductor. That is, the plug 27 is composed of a conductive material. Examples of the conductive material include metals, metal oxides, metal nitrides, and conductive polysilicon. In a case where the first shield electrode 23 is electrically connected to the second shield electrode 24, when a voltage is applied to one of the first shield electrode 23 or the second shield electrode 24, the same voltage is applied to the other one of the first shield electrode 23 or the second shield electrode 24. That is, application and control of voltage is easy. In the present embodiment, the plug 27 extends in the thickness direction of the semiconductor substrate 1.

In the illustrated example, at least one of the insulating layer 8 or the insulating layer 9 is present in the space between the plug 27 and the first photoelectric conversion layer 15a. As a result, direct contact between the plug 27 and the first photoelectric conversion layer 15a is prevented, and a case may be prevented in which appropriate photoelectric conversion is prevented by the plug 27.

As described above, in the present embodiment, the second pixel electrode 13b, the third pixel electrode 13c, the fourth pixel electrode 13d, and the fifth pixel electrode 13e are composed of ITO. Note that the second pixel electrode 13b, the third pixel electrode 13c, the fourth pixel electrode 13d, and the fifth pixel electrode 13e may be composed of, for example, indium zinc oxide (IZO), aluminum-doped zinc oxide (AZO), gallium-doped zinc oxide (GZO), aluminum-magnesium co-doped zinc oxide (AlMgZnO), indium gallium oxide (IGO), indium gallium zinc oxide (IGZO), fluorine-doped indium oxide (IFO), antimony-doped tin oxide (ATO), fluorine-doped tin oxide (FTO), tin oxide ($SnO_2$), zinc oxide (ZnO), boron-doped zinc oxide (BZO), indium tin zinc oxide (ITZO), nickel oxide (NiO), or indium titanium oxide (ITiO) or may also be composed of ITO doped with HfO. These materials may also be used to form the transparent electrodes. Similarly, these materials may also be used to form the first counter electrode 17a, the second counter electrode 17b, the third counter electrode 17c, the fourth counter electrode 17d, and the fifth counter electrode 17e as well as the first shield electrode 23.

In the following, effects of the present embodiment will be further described.

Suppose a camera having the following characteristics.

The camera has a multilayer imaging device.

The multilayer imaging device has a first photoelectric conversion layer and a second photoelectric conversion layer.

The first photoelectric conversion layer is sensitive to infrared light.

The second photoelectric conversion layer is sensitive to visible light.

With such a camera, the second photoelectric conversion layer enables formation of an image based on visual information that the human eye can detect. The first photoelectric conversion layer enables formation of an image based on information that the human eye cannot detect. By superposing both of the images with each other, a combined image can be obtained that reflects information on a wide wavelength region. Such combined images may be used to perform, for example, robotics control. Such robotics control may be useful in, for example, the field of surveillance cameras, industrial fields, and the automotive field.

In a case where imaging is performed using infrared light, a dedicated light source usually needs to be prepared. This is because part of light of the infrared light region is hardly included in sunlight and general artificial illumination. In a case where imaging is performed inside a room, there is especially a substantial need for a dedicated light source being prepared.

However, imaging using a dedicated light source is not always easy. This is because the intensity of light reflected by a subject becomes too high depending on the position of the camera, the reflectivity of the subject, and so forth, so that blown highlights occur. A blown highlight occurs when accumulation of signal charge obtained by photoelectric conversion in a charge accumulation region reaches a saturation level. When blown highlights occur, it becomes difficult to express differences in the intensity of light reflected by a subject as differences in contrast.

In order to suppress blown highlights, a method is conceivable in which the capacitance of a charge accumulation region is increased to increase a dynamic range. In order to increase the capacitance of the charge accumulation region, increasing the size of the charge accumulation region can be considered. However, if the size of the charge accumulation region is increased, another problem may occur. Specifically, there has recently been a trend in which the sizes of pixels of an imaging device are reduced by integrating the pixels so as to have higher density. Increasing the size of the charge accumulation region does not follow this trend.

In this respect, according to the first embodiment, the capacitance density of the first capacitive element 60a, that of the second capacitive element 60b, that of the third capacitive element 60c, that of the fourth capacitive element 60d, and that of the fifth capacitive element 60e can be increased. This enables capacitances to be ensured while suppressing an increase in pixel size.

Furthermore, according to a study carried out by the present inventor, demand for higher resolution is relatively high for image components in the visible light region and is relatively low for image components of infrared light. By considering this, in the first embodiment, in the unit pixel 10, the total number of second to fifth capacitive elements 60b to 60e, which is 4, is made larger than the number of first capacitive elements 60a, which is 1. In contrast, the volume of the first capacitive element 60a is made larger than that of the second capacitive element 60b, that of the third capacitive element 60c, that of the fourth capacitive element 60d, and that of the fifth capacitive element 60e. Setting such magnitude relationships regarding size and volume enables blown highlights in the image components of infrared light to be suppressed while acquiring a necessary resolution for the image components in the visible light region.

Moreover, the imaging device 100A according to the first embodiment can obtain an image with low parallax regarding imaging information based on visible light and imaging information based on infrared light. In this regard, description will be made with reference to FIGS. 13 and 14. FIG. 13 is a schematic diagram illustrating an imaging mode according to a reference embodiment. FIG. 14 is a schematic diagram illustrating an imaging mode according to the first embodiment.

In the reference embodiment illustrated in FIG. 13, imaging is performed using a visible light camera 201 and an infrared light camera 202. The visible light camera 201 acquires imaging information based on visible light regarding an imaging target 205. The infrared light camera 202 acquires imaging information based on infrared light regarding the imaging target 205. In the reference embodiment, imaging information based on visible light and imaging information based on infrared light are obtained using the two cameras, which are the visible light camera 201 and the infrared light camera 202. Note that, in the reference embodiment, there is an unignorable shift between the optical axis of the visible light camera 201 and that of the infrared light camera 202. The shift between the optical axes causes parallax between these pieces of information.

In contrast, according to the first embodiment illustrated in FIG. 14, the imaging device 100A can be installed in one camera 251. That is, the one camera 251 can acquire, regarding the imaging target 205, imaging information based on visible light and imaging information based on infrared light. In this case, parallax between these pieces of information is less likely to occur. Moreover, since the one camera 251 can acquire these pieces of information, simultaneity of these pieces of information is easily ensured.

These pieces of information with low parallax and a high level of simultaneity may be useful for various applications.

For example, in medical applications, when cancer removal surgery is performed, a cancer-affected region is determined using a dye that is indocyanine green. This dye emits infrared fluorescence. Note that the human eye cannot detect infrared light. Thus, infrared fluorescence emitted by this dye is imaged using an infrared light camera. Along with this imaging, imaging information based on visible light is also acquired. In order to precisely grasp the position of a site to be removed, it is preferable that the parallax between the imaging information based on infrared light and the imaging information based on visible light be low. Thus, the technology in the first embodiment may be useful for this application.

Moreover, for example, in applications for autonomous driving of a motor vehicle, it is important to determine, through imaging, what objects are present around the vehicle. However, at nighttime, it is difficult to determine objects using imaging information based on visible light since there is not enough natural light. Thus, it is considered that imaging information based on infrared light is acquired by irradiating the objects with infrared light. Even in a case where there is not enough natural light, the parallax between imaging information based on infrared light and imaging information based on visible light may become noise when an object is to be determined. Thus, it is desirable that parallax be low. Moreover, motor vehicles involve temporal movements. Thus, it is preferable that the level of simultaneity between imaging information based on infrared light and imaging information based on visible light be high. Thus, the technology in the first embodiment may be useful for this application.

In the following, some other embodiments will be described. Elements common to the previous embodiment and its subsequent embodiments are denoted by the same reference symbols, and description thereof may be omitted. Description regarding each embodiment may be applied between the embodiments as long as the resulting description is technically consistent. Some or all of the individual embodiments may be combined with each other as long as combination of the embodiments is technically consistent.

Second Embodiment

In the following, an imaging device 100A according to a second embodiment will be described.

FIG. 15 illustrates, in a plan view, a first capacitive element 60a, a second capacitive element 60b, a third capacitive element 60c, a fourth capacitive element 60d, and a fifth capacitive element 60e according to the second embodiment. Specifically, FIG. 15 illustrates, in a plan view, the electrodes 61 of the first capacitive element 60a, the second capacitive element 60b, the third capacitive element 60c, the fourth capacitive element 60d, and the fifth capacitive element 60e.

FIG. 16 is a cross-sectional view of an imaging element 100 according to the second embodiment, the view illustrating a first cross section parallel to the thickness direction of the semiconductor substrate 1 and taken along line XVI-XVI, which is a first dotted line DL1 of FIG. 15. FIG. 17 is a cross-sectional view of the imaging element 100 according to the second embodiment, the view illustrating a second cross section parallel to the thickness direction of the semiconductor substrate 1 and taken along line XVII-XVII, which is a second dotted line DL2 of FIG. 15.

As is understood from FIGS. 15, 16, and 17, in the second embodiment, the first capacitive element 60a is superposed with the second capacitive element 60b, the third capacitive element 60c, the fourth capacitive element 60d, and the fifth capacitive element 60e in a plan view. The first capacitive element 60a is arranged in a different layer from the second capacitive element 60b, the third capacitive element 60c, the fourth capacitive element 60d, and the fifth capacitive element 60e. With such a configuration, it is easy to ensure the capacitances of the first capacitive element 60a, the second capacitive element 60b, the third capacitive element 60c, the fourth capacitive element 60d, and the fifth capacitive element 60*e*. Thus, the first capacitive element 60*a*, the second capacitive element 60*b*, the third capacitive element 60*c*, the fourth capacitive element 60*d*, and the fifth capacitive element 60*e* easily store large amounts of electric charge.

Furthermore, with the above-described configuration, it is easy to suppress parasitic capacitances generated between the first capacitive element 60*a*, the second capacitive element 60*b*, the third capacitive element 60*c*, the fourth capacitive element 60*d*, and the fifth capacitive element 60*e*. In this regard, the following description will be made. When electric charge is accumulated in the first capacitive element 60*a*, the first electrode 61 of the first capacitive element 60*a* may exhibit a non-zero electric potential. In this case, when the physical distance between the first capacitive element 60*a* and the second capacitive element 60*b* is short, parasitic capacitance may be generated between the first electrode 61 of the first capacitive element 60*a* and the third electrode 61 of the second capacitive element 60*b*. Similarly, parasitic capacitance may be generated between any other two capacitive elements. In this regard, in the second embodiment, the first capacitive element 60*a* is arranged in a different layer from the second capacitive element 60*b*, the third capacitive element 60*c*, the fourth capacitive element 60*d*, and the fifth capacitive element 60*e*. Thus, it is easy to ensure distances between the first capacitive element 60*a*, the second capacitive element 60*b*, the third capacitive element 60*c*, the fourth capacitive element 60*d*, and the fifth capacitive element 60*e*. Thus, it is easy to suppress parasitic capacitances between the first capacitive element 60*a*, the second capacitive element 60*b*, the third capacitive element 60*c*, the fourth capacitive element 60*d*, and the fifth capacitive element 60*e*.

In the second embodiment, in a plan view, the first electrode 61 is superposed with the third electrode 61, the fifth electrode 61, the seventh electrode 61, and the ninth electrode 61. The first electrode 61 is arranged in a different layer from the third electrode 61, the fifth electrode 61, the seventh electrode 61, and the ninth electrode 61.

In the second embodiment, in a plan view, the second electrode 62 is superposed with the fourth electrode 62, the sixth electrode 62, the eighth electrode 62, and the tenth electrode 62. The second electrode 62 is arranged in a different layer from the fourth electrode 62, the sixth electrode 62, the eighth electrode 62, and the tenth electrode 62.

In the second embodiment, in a plan view, the first dielectric 63 is superposed with the second dielectric 63, the third dielectric 63, the fourth dielectric 63, and the fifth dielectric 63. The first dielectric 63 is arranged in a different layer from the second dielectric 63, the third dielectric 63, the fourth dielectric 63, and the fifth dielectric 63.

Regarding the expression "in a plan view, the first capacitive element 60*a* is superposed with the second capacitive element 60*b*, the third capacitive element 60*c*, the fourth capacitive element 60*d*, and the fifth capacitive element 60*e*", description will be made. This expression refers to "at least part of the first capacitive element 60*a* being superposed with at least part of the second capacitive element 60*b*, at least part of the third capacitive element 60*c*, at least part of the fourth capacitive element 60*d*, and at least part of the fifth capacitive element 60*e*". The same applies to the expression "in a plan view, the first electrode 61 is superposed with the third electrode 61, the fifth electrode 61, the seventh electrode 61, and the ninth electrode 61". The same applies to the expression "in a plan view, the second electrode 62 is superposed with the fourth electrode 62, the sixth electrode 62, the eighth electrode 62, and the tenth electrode 62". The same applies to the expression "in a plan view, the first dielectric 63 is superposed with the second dielectric 63, the third dielectric 63, the fourth dielectric 63, and the fifth dielectric 63".

Specifically, in the second embodiment, in a plan view, the first capacitive element 60*a* is superposed with 60% or more of the area of the second capacitive element 60*b*, 60% or more of the area of the third capacitive element 60*c*, 60% or more of the area of the fourth capacitive element 60*d*, and 60% or more of the area of the fifth capacitive element 60*e*. In a plan view, the first electrode 61 is superposed with 60% or more of the area of the third electrode 61, 60% or more of the area of the fifth electrode 61, 60% or more of the area of the seventh electrode 61, and 60% or more of the area of the ninth electrode 61. In a plan view, the second electrode 62 is superposed with 60% or more of the area of the fourth electrode 62, 60% or more of the area of the sixth electrode 62, 60% or more of the area of the eighth electrode 62, and 60% or more of the area of the tenth electrode 62. In a plan view, the first dielectric 63 is superposed with 60% or more of the area of the second dielectric 63, 60% or more of the area of the third dielectric 63, 60% or more of the area of the fourth dielectric 63, and 60% or more of the area of the fifth dielectric 63.

More specifically, in the second embodiment, in a plan view, the first capacitive element 60*a* is superposed with the entire second capacitive element 60*b*, the entire third capacitive element 60*c*, the entire fourth capacitive element 60*d*, and the entire fifth capacitive element 60*e*. In a plan view, the first electrode 61 is superposed with the entire third electrode 61, the entire fifth electrode 61, the entire seventh electrode 61, and the entire ninth electrode 61. In a plan view, the second electrode 62 is superposed with the entire fourth electrode 62, the entire sixth electrode 62, the entire eighth electrode 62, and the entire tenth electrode 62. In a plan view, the first dielectric 63 is superposed with the entire second dielectric 63, the entire third dielectric 63, the entire fourth dielectric 63, and the entire fifth dielectric 63.

Third Embodiment

In the following, an imaging device 100A according to a third embodiment will be described.

FIG. 18 is a cross-sectional view of an imaging element 100 according to the third embodiment, the view illustrating a first cross section parallel to the thickness direction of the semiconductor substrate 1. FIG. 19 is a cross-sectional view of the imaging element 100 according to the third embodiment, the view illustrating a second cross section parallel to the thickness direction of the semiconductor substrate 1.

In the third embodiment, a first capacitive element 60*a*, a second capacitive element 60*b*, a third capacitive element 60*c*, a fourth capacitive element 60*d*, and a fifth capacitive element 60*e* have trench structures. These structures are advantageous from the viewpoint of ensuring the capacitances of the first capacitive element 60*a*, the second capacitive element 60*b*, the third capacitive element 60*c*, the fourth capacitive element 60*d*, and the fifth capacitive element 60*e*. In this case, the trench structures refer to structures that include bends. Specifically, in a capacitive element 60 that has a trench structure, its first electrode 61, its second electrode 62, and its dielectric 63 include bends.

In the third embodiment, in both of the two cross sections parallel to the thickness direction of the semiconductor substrate 1, the first capacitive element 60*a*, the second capacitive element 60*b*, the third capacitive element 60*c*, the fourth capacitive element 60*d*, and the fifth capacitive element 60*e* include bends. In one specific example, these two cross sections are orthogonal to each other. Note that the first capacitive element 60*a*, the second capacitive element 60*b*, the third capacitive element 60*c*, the fourth capacitive element 60*d*, and the fifth capacitive element 60*e* may include bends only in one of the two cross sections that are orthogonal to each other.

In the third embodiment, the second layer 102 is arranged between the semiconductor substrate 1 and the first layer 101. The first layer 101 is stacked above the second layer 102.

Specifically, the semiconductor substrate 1, the wiring layer including the wiring lines 5*a*, 5*b*, 5*c*, 5*d*, and 5*e*, the insulating layer 7, the wiring layer including the wiring lines 4*a*, 4*b*, 4*c*, 4*d*, and 4*e*, the insulating layer 8, the second layer 102, the insulating layer 9, and the first layer 101 are arranged from below to above in this order.

In the third embodiment, the first wavelength region does not include the wavelength region of infrared light but includes that of ultraviolet light. The first photoelectric conversion layer 15*a* of the first photoelectric converter 12*a* converts light of the first wavelength region into first electric charge. The first electric charge generated in this manner is collected by the first pixel electrode 13*a*.

In the third embodiment, the second wavelength region, the third wavelength region, the fourth wavelength region, and the fifth wavelength region are substantially the same as those of the embodiments above. In the third embodiment, the second photoelectric converter 12*b*, the third photoelectric converter 12*c*, the fourth photoelectric converter 12*d*, and the fifth photoelectric converter 12*e* convert, into electric charge, light of substantially the same wavelength regions as in the embodiments above.

Similarly to as in the embodiments above, out of the first photoelectric converter 12*a* and the second photoelectric converter 12*b*, the photoelectric converter closer to the light receiving surface is defined as a proximal photoelectric converter, and the photoelectric converter farther from the light receiving surface is defined as a distal photoelectric converter. In this case, even in the third embodiment, the central wavelength of the wavelength region of light that the proximal photoelectric converter photoelectrically converts is shorter than the central wavelength of the wavelength region of light that the distal photoelectric converter photoelectrically converts.

As is understood from the description above, in the third embodiment, the first photoelectric converter 12*a* is arranged closer to the light receiving surface than the second photoelectric converter 12*b*, the third photoelectric converter 12*c*, the fourth photoelectric converter 12*d*, and the fifth photoelectric converter 12*e* are. Note that the second photoelectric converter 12*b*, the third photoelectric converter 12*c*, the fourth photoelectric converter 12*d*, and the fifth photoelectric converter 12*e* may be arranged closer to the light receiving surface than the first photoelectric converter 12*a* is.

In the third embodiment, the second color filter 19*b*, the third color filter 19*c*, the fourth color filter 19*d*, and the fifth color filter 19*e* are composed of a material that allows ultraviolet light to pass therethrough. The second condenser lens 21*b*, the third condenser lens 21*c*, the fourth condenser lens 21*d*, or the fifth condenser lens 21*e* is composed of a material that allows ultraviolet light to pass therethrough. Examples of such materials are organic materials.

According to the third embodiment, the first capacitive element 60*a*, which has a high capacitance due to its trench structure, and the first pixel electrode 13*a*, which has a large area, are combined, so that an ultraviolet light sensor can be realized that preferably visualizes the distribution of intensity of ultraviolet light. Furthermore, imaging information based on visible light can also be obtained without parallax with respect to this ultraviolet light information. As a result, map information can be obtained in which information regarding the intensity of ultraviolet light is combined with information regarding objects that can be visually confirmed.

According to a study carried out by the present inventor, demand for higher resolution is relatively high for image components in the visible light region and is relatively low for image components of ultraviolet light. By considering this, in the third embodiment, in the unit pixel 10, the total number of second to fifth capacitive elements 60*b* to 60*e*, which is 4, is made larger than the number of first capacitive elements 60*a*, which is 1. In contrast, the volume of the first capacitive element 60*a* may be made larger than that of the second capacitive element 60*b*, that of the third capacitive element 60*c*, that of the fourth capacitive element 60*d*, and that of the fifth capacitive element 60*e*. Setting such magnitude relationships regarding size and volume enables blown highlights in the image components of ultraviolet light to be suppressed while acquiring a necessary resolution for the image components in the visible light region.

In the following, effects of the present embodiment will be further described. Hydrogen is attracting attention as an alternative energy source to petroleum. However, there is concern about hydrogen leakage and so forth. Specifically, hydrogen combustion flame is invisible, and thus it is difficult to grasp the state of hydrogen combustion flame. Thus, use of hydrogen as an energy source has not sufficiently progressed. Hydrogen combustion flame can be made visible by an ultraviolet camera, which is sensitive to ultraviolet light. However, only by using an ultraviolet camera, the place where hydrogen combustion flame is present cannot be identified. In this regard, with the technology according to the present embodiment, a surveillance camera can be realized that can output a synthetic image obtained by combining an image of hydrogen combustion flame based on ultraviolet light and an image based on visible light. With such a surveillance camera, the place where hydrogen combustion flame is present is easily identified. Specifically, with such a surveillance camera, in a case where there is a hydrogen fire at a hydrogen station or the like, an operator can fight the fire safely and reliably while checking, for example, the shape and size of the combustion flame.

Fourth Embodiment

In the following, an imaging device 100A according to a fourth embodiment will be described.

FIG. 20 is a cross-sectional view of an imaging element 100 according to the fourth embodiment, the view illustrating a first cross section parallel to the thickness direction of the semiconductor substrate 1. FIG. 21 is a cross-sectional view of the imaging element 100 according to the fourth embodiment, the view illustrating a second cross section parallel to the thickness direction of the semiconductor substrate 1.

FIG. 22 is a cross-sectional view of the imaging element 100 according to the fourth embodiment, the view illustrating a cross section parallel to the thickness direction of the semiconductor substrate 1. FIG. 22 is a cross-sectional view for describing, for example, the first photoelectric converter 12*a*, a first color filter 19*a*, and a first condenser lens 21*a*, and the position of the plan view is not limited. In FIG. 22, illustration of various elements is omitted. The cross section illustrated in FIG. 22 may be included in the cross section illustrated in FIG. 20. The cross section illustrated in FIG. 22 may be included in the cross section illustrated in FIG. 21. The cross section illustrated in FIG. 22 may be included in a cross section other than the cross sections illustrated in FIGS. 20 and 21.

As illustrated in FIG. 22, the first photoelectric converter 12*a* is arranged in the semiconductor substrate 1. The first photoelectric converter 12*a* includes a photodiode 12*x* and a pinning region 12*y*. The photodiode 12*x* and the pinning region 12*y* are constituted by a diffusion region.

The wavelength region of light that the first color filter 19*a* allows to pass therethrough is the first wavelength region. The first wavelength region includes the wavelength region of infrared light.

Light passes through the first condenser lens 21*a* and the first color filter 19*a* in this order and is incident on the photodiode 12*x*. The photodiode 12*x* generates, upon receiving incident light, positive charge and negative charge. The photodiode 12*x* typically generates electron-hole pairs.

An accumulation control line, which is not illustrated, is connected to the anode of the photodiode 12*x*. When the imaging device 100A is in operation, a predetermined voltage is applied to the accumulation control line. By applying the predetermined voltage to the accumulation control line, one of positive charge or negative charge generated through photoelectric conversion is used as signal charge.

A well region 11, which contains impurities, is provided in the semiconductor substrate 1. The photodiode 12*x* is in contact with the well region 11. The pinning region 12*y* is in contact with the photodiode 12*x*. The pinning region 12*y* is positioned above the photodiode 12*x*.

The pinning region 12*y* is arranged between the photodiode 12*x* and the surface of the semiconductor substrate 1. As a result, a dark current that may be caused due to a defect at the interface between the photodiode 12*x* and the semiconductor substrate 1 is subjected to pinning. As a result, a dark current at the interface between the photodiode 12*x* and the semiconductor substrate 1 can be reduced.

One of the source or the drain of the first reset transistor 37*a* is electrically connected to the photodiode 12*x*. Electric charge generated at the photodiode 12*x* passes through the one of the source or the drain of the first reset transistor 37*a* and is transferred to the first capacitive element 60*a*.

In the fourth embodiment, the photodiode 12*x* and the one of the source or the drain of the first reset transistor 37*a* are directly electrically connected to each other. This configuration is advantageous in terms of reduction of a dark current. Moreover, this configuration is advantageous in terms of reduction of the sizes of pixels. This enables the size of the first photoelectric converter 12*a* and the dynamic range of the imaging device to be increased. Note that a transfer transistor may be interposed between the photodiode 12*x* and the one of the source or the drain of the first reset transistor 37*a*.

It may be possible that neither a MIM structure nor a metal wiring line is provided at a position that is above the photodiode 12*x* and that overlaps the photodiode 12*x* in a plan view. In this manner, light easily reaches the photodiode 12*x*.

As described above, in the fourth embodiment, the first photoelectric converter 12*a* includes a photodiode. Note that, also in the fourth embodiment, the position of the first photoelectric converter 12*a* is different from the position of the second photoelectric converter 12*b* in the thickness direction of the semiconductor substrate 1. Thus, also in the present embodiment, the first photoelectric converter 12*a* and the second photoelectric converter 12*b* are arranged in different layers from each other.

As is understood from the description above, in the fourth embodiment, the wavelength region of light that the first color filter 19*a* allows to pass therethrough includes the wavelength region of infrared light, and the photodiode 12*x* converts infrared light into first electric charge. Note that the wavelength region of light that the first color filter 19*a* allows to pass therethrough may include the wavelength region of ultraviolet light, and the photodiode 12*x* may convert ultraviolet light into first electric charge.

Embodiment of Camera System

FIG. 23 illustrates the configuration of a camera system 500. The camera system 500 includes an imaging device 100A, an infrared light source 501, a lens 502, an image signal processor (ISP) 503, a signal processing circuit 504, an edge processing circuit 505, and an edge processing circuit 506. The camera system 500 is configured to process data obtained by the imaging device 100A and output the data to the outside. As the imaging device 100A, any one of the imaging devices that have been described in the first to fourth embodiments can be used.

Infrared light L1 is emitted from the infrared light source 501 toward an object OB. The imaging device 100A receives light L2 from the object OB through the lens 502. The imaging device 100A outputs data based on visible light and data based on infrared light through two channels. The data based on visible light is processed by the ISP 503. As a result, a full-color image is obtained. The full-color image is transferred to an external display 509*a* and is displayed. The full-color image is processed by the edge processing circuit 506 and is thereafter transferred to a cloud/external device 508*a*. In this case, a cloud/external device refers to at least one of an external device or the cloud. In other words, the cloud/external device refers to the external device, the cloud, or both of the external device and the cloud. The data based on infrared light is processed by the signal processing circuit 504. As a result, an image based on infrared light is obtained. The signal processing circuit 504 may be configured to calculate, for example, the distance to the object from the data based on infrared light. The image based on infrared light is transferred to an external display 509*b* and is displayed. The image based on infrared light is processed by the edge processing circuit 505 and is thereafter transferred to a cloud/external device 508*b*. It is also possible to combine the full-color image with the image based on infrared light and display the resulting image on an external display 509*c*.

Instead of the infrared light source 501 or together with the infrared light source 501, an ultraviolet light source may be used. In this case, instead of image data based on infrared light or together with the image data based on infrared light, image data based on ultraviolet light can be obtained.

Various changes may be made to the first to fourth embodiments and the embodiment of the camera system. For example, in the first to fourth embodiments, the second color filter 19*b* may be omitted, and a photoelectric conversion layer that is sensitive to light of the second wavelength region may be used as the second photoelectric conversion layer 15*b*. The third color filter 19*c* may be omitted, and a photoelectric conversion layer that is sensitive to light of the third wavelength region may be used as the third photoelectric conversion layer 15*c*. The fourth color filter 19*d* may be omitted, and a photoelectric conversion layer that is sensitive to light of the fourth wavelength region may be used as the fourth photoelectric conversion layer 15*d*. The fifth color filter 19*e* may be omitted, and a photoelectric conversion layer that is sensitive to light of the fifth wavelength region may be used as the fifth photoelectric conversion layer 15*e*.

In the first to third embodiments, a color filter may be added that allows light of the first wavelength region to pass therethrough, and light may be incident, via the color filter, on the first photoelectric conversion layer 15*a*. In the fourth embodiment, the first color filter 19*a* may be omitted, and a photodiode that is sensitive to light of the first wavelength region may be used as the photodiode 12*x*.

In the first embodiment, the second embodiment, and the fourth modification, the first wavelength region may include the wavelength region of ultraviolet light. In the third embodiment, the first wavelength region may include the wavelength region of infrared light.

In the second embodiment, the first capacitive element 60*a* is located below the second capacitive element 60*b*, the third capacitive element 60*c*, the fourth capacitive element 60*d*, and the fifth capacitive element 60*e*. Note that the first capacitive element 60*a* may be located above the second capacitive element 60*b*, the third capacitive element 60*c*, the fourth capacitive element 60*d*, and the fifth capacitive element 60*e*.

A capacitive element 60 having a trench structure according to the third embodiment can be used in the first embodiment, the second embodiment, and the fourth embodiment. In the third embodiment, a capacitive element 60 according to the first embodiment may be used.

The technologies disclosed herein are useful for imaging elements. The imaging elements may be used in imaging devices, optical sensors, and so forth. Examples of the imaging devices include camera systems such as digital still cameras, medical cameras, surveillance cameras, vehicle-mounted cameras, digital single-lens reflex cameras, and digital mirrorless interchangeable-lens cameras.

What is claimed is:

1. An imaging device comprising:
an insulating layer;
a first photoelectric converter that converts light having a wavelength in a first wavelength region into first electric charge;
a first capacitive element that is disposed in the insulating layer and accumulates the first electric charge, the first capacitive element including a first electrode, a second electrode and a first dielectric, the second electrode facing the first electrode, the first dielectric being arranged between the first electrode and the second electrode;
a second photoelectric converter that converts light having a wavelength in a second wavelength region into second electric charge; and
a second capacitive element that is disposed in the insulating layer and accumulates the second electric charge, the second capacitive element including a third electrode, a fourth electrode and a second dielectric, the fourth electrode facing the third electrode, the second dielectric being arranged between the third electrode and the fourth electrode, wherein:
the insulating layer, the first photoelectric converter, and the second photoelectric converter are stacked on each other, and
the second photoelectric converter is arranged at a different height from the first photoelectric converter in a stacking direction of the insulating layer, the first photoelectric converter, and the second photoelectric converter.

2. The imaging device according to claim 1, further comprising:
a semiconductor substrate,
wherein the first dielectric has a higher permittivity than an oxide of a semiconductor material of the semiconductor substrate.

3. The imaging device according to claim 1,
wherein the first dielectric has a thickness of greater than or equal to 10 nm and less than or equal to 45 nm.

4. The imaging device according to claim 1,
wherein the first capacitive element has a metal-insulator-metal structure.

5. The imaging device according to claim 1, wherein
the first electrode has a first opposing surface,
the second electrode has a second opposing surface,
the third electrode has a third opposing surface,
the fourth electrode has a fourth opposing surface,
the first opposing surface and the second opposing surface face each other,
the third opposing surface and the fourth opposing surface face each other,
the first opposing surface has a larger area than the third opposing surface,
the second opposing surface has a larger area than the fourth opposing surface,
the first wavelength region includes a wavelength region of infrared light, and
the second wavelength region includes a wavelength region of visible light.

6. The imaging device according to claim 1,
wherein, in a plan view, the first capacitive element and the second capacitive element are superposed with each other.

7. The imaging device according to claim 6, further comprising:
a third capacitive element,
wherein, in the plan view, the first capacitive element is superposed with the second capacitive element and the third capacitive element.

8. The imaging device according to claim 1,
wherein the first capacitive element and the second capacitive element are arranged at identical heights in the stacking direction.

9. The imaging device according to claim 8, further comprising:
a third capacitive element;
a fourth capacitive element; and
a fifth capacitive element, wherein
in a case where, in a plan view, a rectangle having a smallest area among a plurality of rectangles that contain the first capacitive element is defined as a reference rectangle,
a straight line including one of two diagonals of the reference rectangle is defined as a first straight line, and
a straight line including another one of the two diagonals is defined as a second straight line,
in the plan view, the first straight line passes through the second capacitive element, the first capacitive element, and the third capacitive element in this order, and
in the plan view, the second straight line passes through the fourth capacitive element, the first capacitive element, and the fifth capacitive element in this order.

10. The imaging device according to claim 1, wherein
the first wavelength region includes a wavelength region of infrared light,
the second wavelength region includes a wavelength region of visible light, and the first capacitive element has a higher capacitance than the second capacitive element.

11. The imaging device according to claim 1, wherein the first wavelength region includes a wavelength region of infrared light, the second wavelength region includes a wavelength region of visible light, the first photoelectric converter includes a first photoelectric conversion layer that generates the first electric charge, the first photoelectric converter includes a first pixel electrode that collects the first electric charge, the second photoelectric converter includes a second photoelectric conversion layer that generates the second electric charge, the second photoelectric converter includes a second pixel electrode that collects the second electric charge, and in a plan view, the first pixel electrode has a larger area than the second pixel electrode.

12. The imaging device according to claim 11, wherein the first photoelectric converter further includes a first counter electrode, the first photoelectric conversion layer is arranged between the first counter electrode and the first pixel electrode, the second photoelectric converter further includes a second counter electrode, the second photoelectric conversion layer is arranged between the second counter electrode and the second pixel electrode, and the first counter electrode and the second counter electrode are electrically separated from each other.

13. The imaging device according to claim 1, wherein in a case where, out of the first photoelectric converter and the second photoelectric converter, a photoelectric converter closer to a light receiving surface of the imaging device is defined as a proximal photoelectric converter, and a photoelectric converter farther from the light receiving surface is defined as a distal photoelectric converter, a central wavelength of a wavelength region of light that the proximal photoelectric converter photoelectrically converts is shorter than a central wavelength of a wavelength region of light that the distal photoelectric converter photoelectrically converts.

14. The imaging device according to claim 1, further comprising:

a first reset transistor that has a gate and resets electric potential of the first capacitive element; and a second reset transistor that has a gate and resets electric potential of the second capacitive element, wherein the first reset transistor has a larger gate width than the second reset transistor.

15. The imaging device according to claim 1, further comprising:

a plurality of unit pixels arranged in a matrix shape, wherein each of the plurality of unit pixels includes the first photoelectric converter, the second photoelectric converter, a third photoelectric converter, the first capacitive element, the second capacitive element, and a third capacitive element, the first wavelength region includes a wavelength region of infrared light, the second wavelength region includes a wavelength region of first color light, the third photoelectric converter converts second color light into third electric charge, and the third capacitive element accumulates the third electric charge.

16. The imaging device according to claim 1, wherein the first photoelectric converter includes a first photoelectric conversion layer that generates the first electric charge, the first photoelectric converter includes a first pixel electrode that collects the first electric charge, the second photoelectric converter includes a second photoelectric conversion layer that generates the second electric charge, the second photoelectric converter includes a second pixel electrode that collects the second electric charge, in a plan view, the first pixel electrode has a larger area than the second pixel electrode, and the first capacitive element has a higher capacitance than the second capacitive element.

* * * * *